US009755063B1

(12) United States Patent
Howard et al.

(10) Patent No.: US 9,755,063 B1
(45) Date of Patent: Sep. 5, 2017

(54) RF SOI SWITCHES INCLUDING LOW DIELECTRIC CONSTANT FEATURES BETWEEN METAL LINE STRUCTURES

(71) Applicant: Newport Fab, LLC, Newport Beach, CA (US)

(72) Inventors: David J. Howard, Irvine, CA (US); Rassul Karabalin, Huntington Beach, CA (US); Michael J. DeBar, Tustin, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 15/189,904

(22) Filed: Jun. 22, 2016

(51) Int. Cl.
  *H01L 21/322* (2006.01)
  *H01L 29/66* (2006.01)
  *H01L 29/78* (2006.01)
  *H01L 29/06* (2006.01)
  *H01L 29/04* (2006.01)

(52) U.S. Cl.
  CPC ............. *H01L 29/78* (2013.01); *H01L 29/04* (2013.01); *H01L 29/0649* (2013.01); *H01L 29/66477* (2013.01)

(58) Field of Classification Search
  USPC ........................... 257/153, 162; 438/133–138
  See application file for complete search history.

(56) References Cited

U.S. PATENT DOCUMENTS 8,026,131 B2 * 9/2011 Botula .............. H01L 21/76224
 257/347
8,674,472 B2 * 3/2014 Botula .............. H01L 21/76289
 257/522

\* cited by examiner

*Primary Examiner* — Calvin Lee
(74) *Attorney, Agent, or Firm* — Bever, Hoffman & Harms, LLP

(57) ABSTRACT

An RF SOI switch includes patterned or self-aligned low-k features (i.e., low-k polymer structures or voids) in the PMD and/or subsequently formed inter-metal dielectric layers to reduce capacitive coupling. All portions of the dielectric layers through which metal contact/via structures pass are pre-designated as reserved regions, and formation of the low-k features is restricted to interstitial regions located between adjacent reserved regions. After the low-k features are formed, dielectric material is deposited into all reserved regions, and then the metal contact/via structures are formed according to standard practices through the dielectric material disposed in the reserved regions. The low-k features are formed by polymer material sandwiched between two passivation layers. Optional openings are formed through the upper passivation layer, and then the polymer material is asked out to generate void-type features. Optionally, polymer is spin-coated over the metal line structures, then etched back to form self-aligned low-k features.

13 Claims, 15 Drawing Sheets

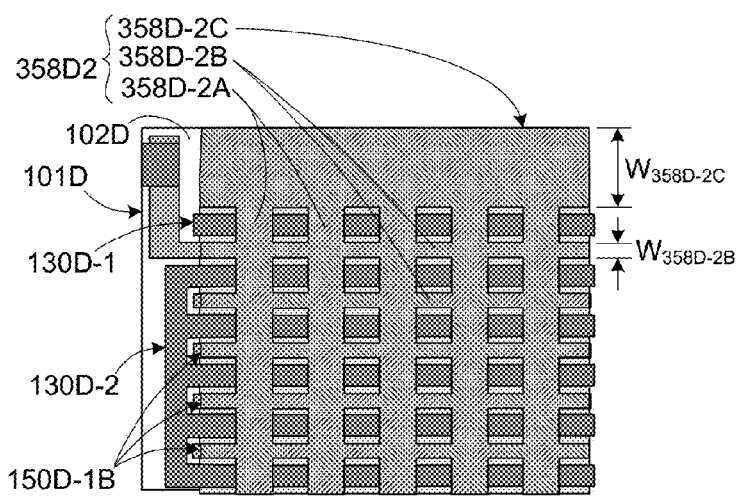
FIG. 12(G)
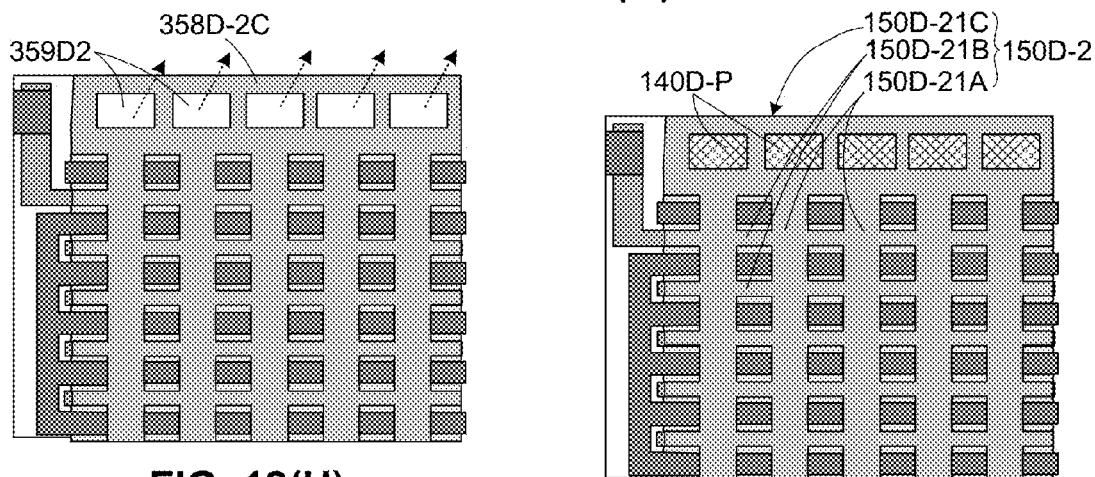
FIG. 12(H)
FIG. 12(I)
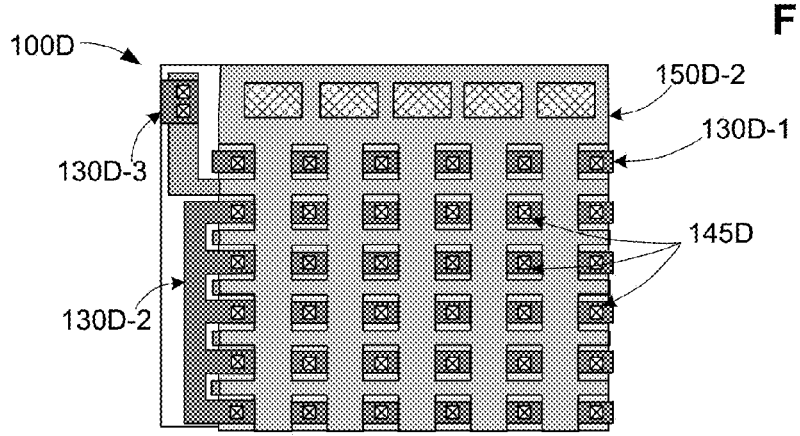
FIG. 12(J)

RF SOI SWITCHES INCLUDING LOW DIELECTRIC CONSTANT FEATURES BETWEEN METAL LINE STRUCTURES

FIELD OF THE INVENTION

This invention relates to Radio Frequency (RF) switches, and more particularly to methods and structures that can be utilized to improve the operating characteristics of RF SOI switches.

BACKGROUND OF THE INVENTION

RF switches are component devices commonly utilized in wireless communication devices (e.g., cellular or smart phones) to route high-voltage, low- and high-frequency signals through transmission paths between the device's processing circuitry and the device's antenna. State-of-the-art attenuation and antenna tuning applications in such wireless communication devices require RF switches capable of transmitting RF signals up to 70V and in the range of 0.5 GHz to 6 GHz with a high degree of linearity. To accommodate the high-power RF signals, current state-of-the-art RF switches typically utilize several low voltage (e.g., 2-5V) NMOS transistors connected in a stacked (drain-to-source) arrangement such that the high RF signal voltage is distributed evenly across the low voltage transistors. With this arrangement, a first RF switch can be turned on to route high frequency signals from a device's processing circuitry to the device's antenna during transmission-mode operations, and a second RF switch can be turned on to signals from the device's antenna to the device's processor during receiving-mode operations.

RF switches that are produced using silicon-on-insulator (SOI) technology (referred to herein as RF SOI switches) were developed in response to a demand for low-cost solid state RF switches utilized in cellular phones and other low-cost wireless communication devices. Silicon on insulator (SOI) technology refers to the use of a layered silicon-insulator-silicon substrate in place of conventional monocrystalline silicon substrates in semiconductor manufacturing, especially microelectronics, to reduce parasitic device capacitance, thereby improving performance. Early SOI technology was considered impractical for RF switch applications due to cutoff frequency and breakdown voltage problems, so early solid-state RF switches were typically generated using silicon-on-sapphire (SOS) and gallium-arsenide monolithic microwave integrated circuit (GaAs MMIC) technologies. However, due to recent advances in CMOS SOI technology that addressed the early problems, RF SOI switches produced using CMOS and SiGe BiCMOS flows (and in some instances using RF MEMS fabrication flows) are now recognized as achieving comparable operating characteristics to SOS and GaAs Monolithic microwave integrated circuit (MMIC) switches at a substantially lower cost. Moreover, because SOI technology uses standard technologies and standard cell libraries developed for CMOS, BiCMOS and RF MEMS fabrication flows, RF SOI switches can be integrated into larger system-on-chip (SOC) devices that further minimize fabrication costs.

RF SOI switches are field-effect transistor-type (FET-type) structures that are mainly distinguished from other FET-type transistors in that they are formed on/over isolated silicon pads (islands) of an SOI base substrate, but are otherwise produced using the same standard processes of the core (i.e., CMOS, BiCMOS or RF MEMS) fabrication flow that are utilized to simultaneously fabricate other circuit structures of a SOC device on the SOI base substrate. That is, the SOI substrate is processed using known techniques to generate spaced-apart silicon islands (i.e., portions of the topmost silicon layer that rests on and are entirely surrounded by insulating material, typically silicon dioxide). The structural elements of the RF SOI switch are then fabricated onto an associated silicon island using the same standard fabrication flow processes that are utilized to simultaneously generate other circuit structures of the SOC device. For example, the same standardized n-type or p-type dopant diffusion processes are utilized to form source/drain regions in both the silicon island (i.e., for the RF SOI switch) and in other portions of the topmost silicon (e.g., to produce transistors forming a processor circuit or other functional circuitry of the SOC device). Similarly, the same polycrystalline silicon (polysilicon) gate structure formation processes (e.g., poly deposition, mask and etch) are utilized to form the gate structures of the RF SOI switch, and to simultaneously form gate structures of the SOC device's functional circuitry. Next, the same pre-metal dielectric (PMD) layer formation process is utilized to form a PMD layer over the polysilicon gate structures of both the RF SOI switch and the other functional circuitry, and the same contact structure formation processes (e.g., mask, etch, metal deposition, and chemical mechanical polishing or other planarizing process) is used to form contacts to the source/drain regions in both the RF SOI switch and the functional circuitry. Subsequent backend processing (e.g., metallization and contact pad formation) are similarly simultaneously performed over both the RF SOI switch and the other functional circuitry of the SOC device.

As the demand for wireless communication devices capable of higher data-rate transmissions continues to grow, there is a concomitant demand for RF SOI switches that exhibit ever-improving operating characteristics. A conventional approach for improving the operating characteristics of an RF SOI switch is to minimize the switch's $R_{on} \cdot C_{off}$, which is a common figure of merit used to rate the performance of RF switches. An RF SOI switch's $R_{on}$ value is determined by measuring the resistance across the switch when turned on (e.g., in the NMOS case, when a high gate voltage is applied), and the RF SOI switch's $C_{off}$ value is determined by measuring the capacitance across the switch when turned off. The $R_{on} \cdot C_{off}$ value is determined by multiplying a switch's measured $R_{on}$ and $C_{off}$ values, and therefore the operating characteristics of the RF switch can, in theory, be improved by way of reducing one or both of the $R_{on}$ and $C_{off}$ values. That is, reducing the $R_{on}$ value would allow more of the RF signal to travel through the RF switch when turned on, and reducing the $C_{off}$ value would prevent more of the RF signal from traveling through the switch when turned off. It is important to note that the figure of merit—RonxCoff—is determined from not just one switch but the switch(s) environment(s). The environment of the device, includes the switch but can also include the wiring and interconnect, the substrate, packaging, and all the parasitics (R, L, C's) associated with the surrounding device or device arrays.

One challenge associated with improving the operating performance of RF SOI switches is additional cost associated with changes to an existing RF SOI switch design. That is, once a fabrication (e.g., CMOS) flow is established that facilitates formation of RF SOI switches of a particular type, the introduction of new structural features or materials or other design changes require either changes to the established fabrication flow to accommodate the design changes.

What are needed are structural features and methods that improve the operating characteristics (e.g., $C_{off}$ and $R_{on}$) of RF SOI switches that address the problems presented above. What is particularly needed are structural features that can be used to improve the operating characteristics of existing RF SOI switches, and that are easily incorporated into established fabrication flows (e.g., CMOS, BiCMOS or RF MEMS) using minimal addition processing and without requiring modifications to the established flow's processes.

SUMMARY OF THE INVENTION

The present invention is directed to FET-type RF SOI switches and associated fabrication methods in which low dielectric constant (low-k) features are embedded (formed) within one or more of the switch's dielectric layers to displace portions of the higher-k dielectric layer material in a manner that reduces the switch's $C_{off}$ operating characteristic.

Each RF SOI switch formed in accordance with the present invention is similar to conventional FET-type RF SOI switches in that it is formed on an isolated silicon island of an SOI (base) substrate, and generally includes elongated source/drain (doped) regions separated by intervening elongated channel (undoped) regions, an elongated polycrystalline silicon (polysilicon) gate structure disposed over each channel region, at least two (i.e. pre-metal and first-metal) dielectric layers disposed over the silicon island, spaced-apart metal line structures extending horizontally through the dielectric layers, and periodically spaced metal contact/via structures extending vertically through the dielectric layers below and/or above the metal line structures. The dielectric layers include one or more standard dielectric materials (e.g., $SiO_2$) that collectively generate a (first) dielectric constant.

According to an aspect of the present invention, each RF SOI switch formed in accordance with the present invention differs from conventional FET-type RF SOI switches in that portions of the standard dielectric material located between the metal line and polymer gate structures in the dielectric layers is replaced with low-k features (i.e., polymer structures, or gas- or vacuum-filled void regions having lower dielectric constants than that of the standard dielectric layer material). According to another aspect of the present invention, the low-k features are only formed in predetermined "interstitial" regions of the dielectric layers such that the low-k features do interfere with the subsequent formation of metal contact or via structures. By replacing the portions of the dielectric material that would otherwise be disposed in these "interstitial" regions with the low-k features, the present invention provides significant improvement in an RF SOI switch's operating characteristics by way of reducing capacitive coupling between adjacent metal line structures and/or capacitive coupling between the metal line structures and the polysilicon gate structures.

According to another embodiment of the present invention, the low-k features are formed in designated interstitial regions that are positioned such that the presence of the low-k features does not affect the subsequent formation of metal contact or via structures, whereby the present invention can be used to improve the operating characteristics of currently produced RF SOI switches without requiring significant modification to the established fabrication flow. The modified fabrication methodologies are performed after performing front-end processing, and/or after completing the formation of each metallization layer, and begins by forming low-k features (i.e., low-k polymer structures or void regions) in predetermined interstitial regions at least partially located over the poly gates and between the source/drain regions (i.e., not in predetermined reserved regions that will be subsequently occupied by contact/via structures). After the low-k features are formed, a dielectric layer (e.g., the pre-metal dielectric layer or any subsequent dielectric layer) is formed by depositing dielectric material according to the established fabrication flow such that dielectric material is disposed over and/or around the low-k features, whereby the dielectric material fills all other regions (including the predetermined reserved regions) that are not occupied by the low-k features. After the dielectric layer deposition is completed, contact/via structures are then formed by planarizing and etching openings into corresponding reserved regions of the dielectric material, and then depositing metal material into the openings according to the established fabrication flow. Note that, because the low-k features are only located in interstitial regions of each dielectric layer, and because the contact/via structures are only formed in the reserved regions occupied solely by dielectric material, each completed contact/via structure is separated from all adjacent low-k features by associated intervening portions of dielectric layer material. As mentioned above, the thus-produced low-k features reduce $C_{off}$ in the RF SOI switches by displacing the higher-k dielectric materials that would otherwise exist in the interstitial regions, thereby reducing capacitive coupling between the adjacent polysilicon/metal structures. By locating the low-k features away from the contacts/vias, the methodologies of the present invention avoid changes to the established contact/via etch and formation processes (i.e., these processes do not require change to, for example, facilitate etching through polymer instead of $SiO_2$), whereby reliability and yield of the established fabrication flow are substantially maintained. Accordingly, the present invention provides methodologies that can be utilized to effectively reduce $C_{off}$ in an RF SOI switch currently being produced by an established fabrication (e.g., CMOS, BiCMOS or RF MEMS) flow by way of providing strategically positioned low-k features using minimal addition processing and avoiding modifications to the established fabrication flow processes.

Various novel approaches are utilized to produce RF SOI switches utilizing the features and generalized methodologies mentioned above.

According to a first approach, patterned low-k features are generated in the PMD and/or one or more inter-metal dielectric layers, for example, using direct polymer patterning techniques, using an oxide layer or other hard mask, or using a resist to selectively remove portions of a polymer layer. In each of these approaches, one or more masks must be added to the fabrication flow, but polymer patterning is a low temperature that does not significantly affect thermal budgets, so an established fabrication flow is essentially unchanged by the polymer patterning process. In alternative exemplary embodiments, elongated patterned polymer structures are generated that are aligned perpendicular to the polysilicon gate structures, parallel to the polysilicon gate structures, or in a mesh-pattern (i.e., both parallel and perpendicular to the polysilicon gate structures), where in each instance the polymer structures are disposed only in predetermined interstitial regions so as not to interfere with the subsequent formation of metal contact and/or via structures. In embodiments where the low-k features are implemented by retaining the patterned polymer structures, the patterned polymer structures are implemented using a low-k polymer material such as polyimide, polynorbornene, benzocyclobutene or polytetrafluoroethylene (PTFE) is used. In presently preferred embodiments, passivation is deposited before and after the patterned polymer structures are formed to minimize changes to the surface environment onto which the dielectric material is subsequently deposited, and to facilitate the formation of void-type features. To generate void-type features, openings are etched into the upper passivation layer, then the polymer material is removed from between the upper and lower passivation layers (e.g., ashed out using oxygen plasma), and then the openings defined through in the upper passivation layer are plugged by the subsequently deposited dielectric layer material. In alternative embodiments, the patterned low-k features are formed in one or more of the pre-metal dielectric layer, the first inter-metal dielectric layer, and/or in any subsequently formed dielectric layers.

According to a second approach, self-aligned low-k features are generated in one or more inter-metal dielectric layers by way of forming an unpatterned polymer layer over metal line structures, and then using an isotropic etch until upper surfaces of the metal line structures are exposed for subsequent formation of metal via structures. In a presently preferred embodiment, a thin dielectric layer is formed over the metal line structures prior to forming the polymer layer using a spin coating process. By utilizing a suitable isotropic etch technique (e.g., time-based or stop-on-metal-based), the metal line structures are reliably exposed for further processing. According to the self-aligned approach, because the RF SOI switch only includes vias in the first-metal dielectric layer that contact upper surfaces of the Metal-1 structures (i.e., none of the vias bypass the Metal-1 structures and contact the substrate or other underlying structures), an effective reserved region in one or more inter-metal dielectric layers is defined above the upper surfaces of the metal line structures, and an effective interstitial region is defined below the upper surfaces of the metal line structures. Further, because the spin-coated polymer forms thicker layer sections over densely pitched metal line structures than over widely spaced metal line structures, the isotropic etch produces relatively large polymer-structure-type low-k features between closely spaced metal line structures, where capacitive coupling issues are maximized, and relatively small (or none) polymer-structure-type low-k features between widely spaced metal line structures, where capacitive coupling issues are minimized. Accordingly, by forming polymer-type low-k features using the self-aligned approach, the present invention facilitates a self-adjusting method for reducing $C_{off}$ using zero additional masks and minimal additional processing that seamlessly integrates into established fabrication flows.

BRIEF DESCRIPTION OF THE DRAWINGS

These and other features, aspects and advantages of the present invention will become better understood with regard to the following description, appended claims, and accompanying drawings, where:

FIGS. 12(A), 12(B), 12(C), 12(D), 12(E), 12(F), 12(G), 12(H), 12(I) and 12(J) are top plan views showing the production of mesh-pattern, void-type low-k features according to another exemplary embodiment;

DETAILED DESCRIPTION OF THE DRAWINGS

The present invention relates to an improvement in RF SOI switches. The following description is presented to enable one of ordinary skill in the art to make and use the invention as provided in the context of a particular application and its requirements. As used herein, directional terms such as "upper", "upward", "lower", and "downward" are intended to provide relative positions for purposes of description, and are not intended to designate an absolute frame of reference. In addition, the term "integral" is used herein to describe the connective relationship between two portions of a single simultaneously formed structure, and are distinguished from the terms "connected" or "coupled", which indicates two separate structures that are joined by way of, for example, adhesive, fastener, clip, or movable joint. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
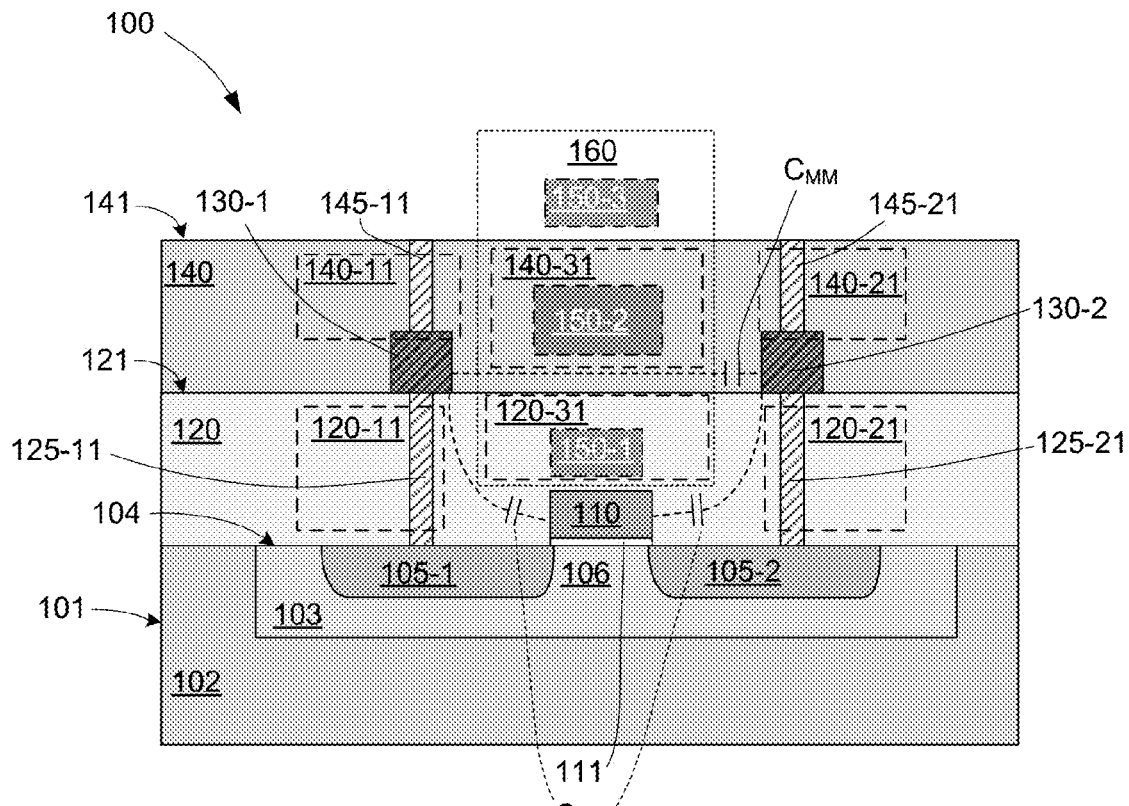
FIG. 1 is a cross-sectional side view showing a simplified RF SOI switch according to an exemplary embodiment of the present invention.
Figure 2:
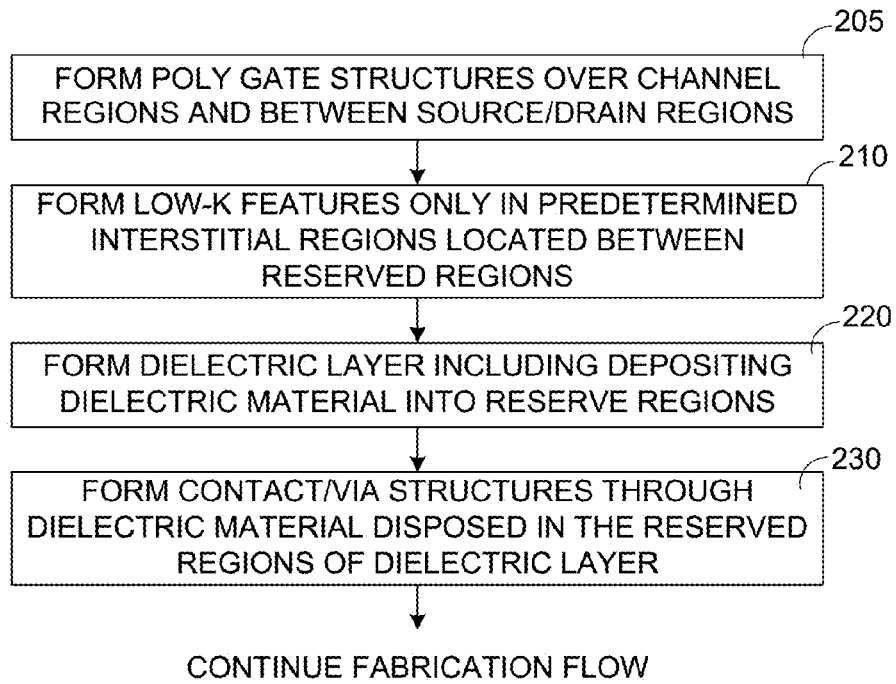
FIG. 2 is a flow diagram showing a generalized methodology for producing the RF SOI switch of claim 1 according to another embodiment of the present invention.
Figure 3:
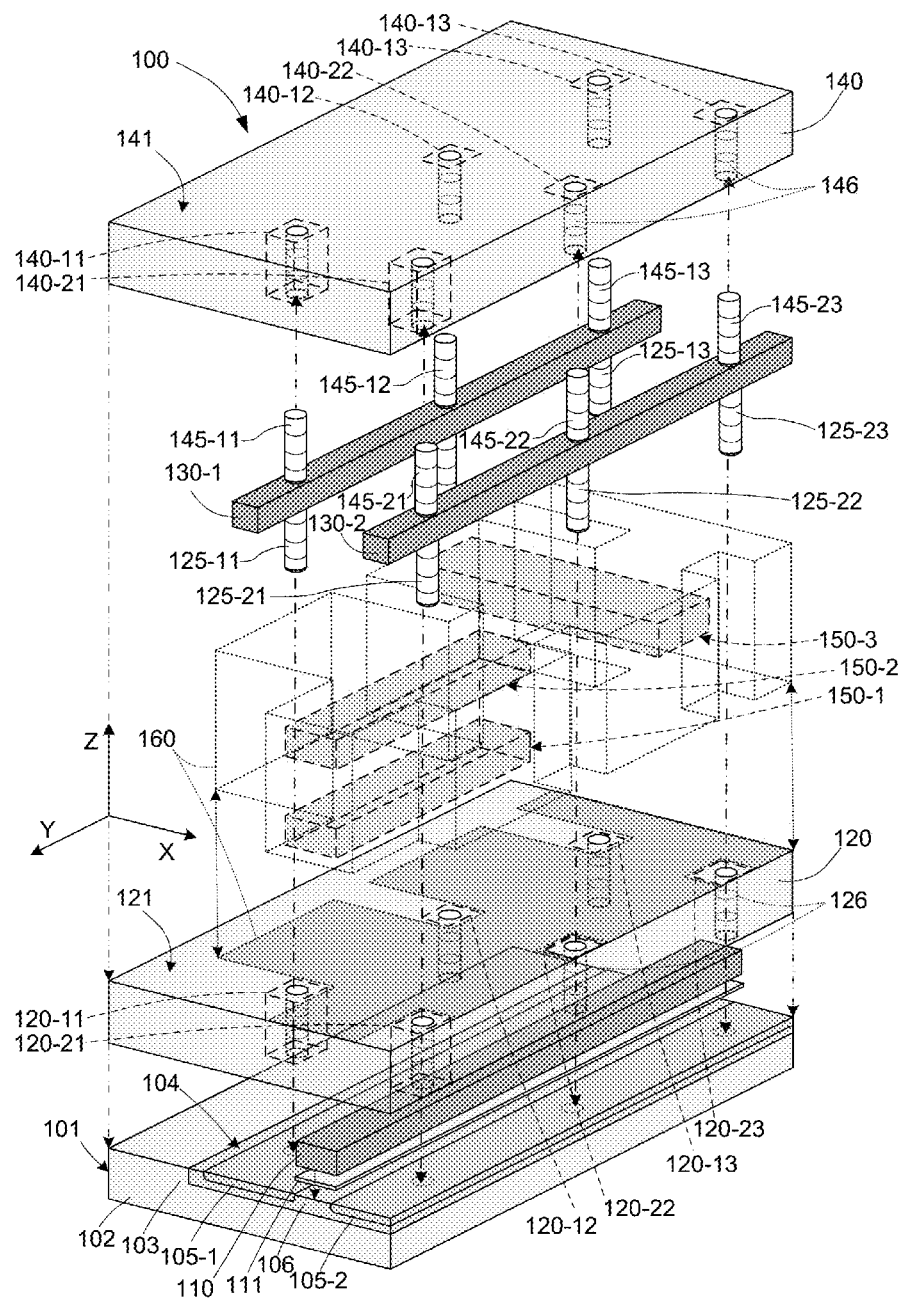
FIG. 3 is an exploded perspective view showing the RF SOI switch of FIG. 1 in additional detail.

FIG. 1 is a cross-sectional view showing an field-effect-transistor-type (FET-type) RF SOI switch 100 according to a simplified embodiment of the present invention, FIG. 2 is a flow diagram showing a generalized methodology for producing RF SOI switch 100, and FIG. 3 is an exploded cross-sectional view showing RF SOI switch 100 in additional detail.

Referring to the lower portion of FIG. 1, switch 100 is formed on an SOI substrate 101 including a (lower) oxide layer 102, an optional bottommost "handler" wafer (not shown) below oxide layer 102, and a topmost silicon layer that is separated into electrically isolated silicon pads (islands) including silicon island 103 (the remaining silicon islands of SOI substrate 101 are omitted for brevity). More specifically, switch 100 is formed in and over an upper surface 104 of a silicon island 103, which is isolated from other silicon islands of substrate 101 by way of etching or otherwise patterning the topmost silicon layer using known techniques such that oxide material entirely surrounds the outside edges of silicon island 103. In a practical embodiment, other circuitry (e.g., functional circuitry of an SOC device, not shown) is formed on other silicon islands of SOI substrate 101, and is operably coupled to switch 100 by way of metal line structures such as those mentioned below.

As indicated in FIG. 1 and FIG. 3, similar to conventional FET-type RF SOI switches, RF SOI switch 100 generally includes elongated source/drain (e.g., n-doped) regions 105-1 and 105-2 implanted into silicon island 103 and separated by intervening elongated channel (e.g., p-type) region 106, an elongated polycrystalline silicon (polysilicon) gate structure 110 disposed channel region 106, at least two dielectric layers (i.e. pre-metal dielectric (PMD) layer 120 and first-metal dielectric layer 140) disposed over silicon island 103. As indicated in FIG. 3, elongated first-metal (Metal-1) structures 130-1 and 130-2 extending horizontally between dielectric layers 120 and 140, with periodically spaced metal contact/via structures (i.e., contact structures 125-11 to 125-13 and 125-21 to 125-23, and via structures 145-1 to 145-13 and 145-21 to 145-23, collectively referred to herein as contact/via structures") extending vertically through dielectric layers 120 and 140 below and above the metal line structures 130-1 and 130-2. Specifically, metal contact structures 125-11 to 125-13 extend downward from metal line structure 130-1 through corresponding portions of PMD layer 120, and metal contact structures 125-21 to 125-23 extend downward from metal line structure 130-2 through corresponding portions of PMD layer 120. Similarly, metal via structures 145-11 to 145-13 extend upward from metal line structure 130-1 into corresponding portions of inter-metal dielectric layer 140, and metal via structures 145-21 to 145-23 extend upward from metal line structure 130-2 into corresponding portions of inter-metal dielectric layer 140. Referring to FIG. 1, metal line structure 130-2 are formed on an upper surface 121 of PMD layer 120, and the metal contact structures (e.g., contact structures 125-11 and 125-21) are operably configured to electrically connect Metal-1 structures 130-1 and 130-2 to source/drain regions 105-1 and 105-2, respectively. Similar to conventional RF SOI switches, dielectric layers 120 and 140 include one or more standard dielectric materials (e.g., $SiO_2$) that collectively generate an associated dielectric constant, as is well-known in the art.

Referring to FIG. 1, RF SOI switch 100 is distinguishable from conventional FET-type RF SOI switches in that low-k features 150-1 to 150-3 are disposed in one or more of the dielectric layers formed over polysilicon gate structure 110, thereby displacing portions of the standard dielectric material that typically substantially entirely forms these dielectric layers. FIG. 1 indicates that low-k feature 150-1 is disposed in PMD layer 120, low-K feature 150-2 is disposed in first inter-metal dielectric layer 140, and low-k feature 150-3 is disposed in an additional dielectric layer (not down) disposed over dielectric layer 140. As described in detail below, low-k features 150-1 to 150-3 either comprise a low-k polymer material or gas- or vacuum-filled void regions (voids), with each of these embodiments having dielectric constants lower than that of the displaced standard dielectric layer material.

According to an aspect of the invention, regions of the various dielectric layers through which contact/via structures pass are designated as predetermined "reserved regions", and low-k features 150-1 to 150-3 are only formed in predetermined "interstitial regions" of the dielectric layers located between two or more reserved regions. Referring to FIG. 1, metal contact structure 125-11 extends vertically downward from metal line structure 130-1 through a (first) reserved region 120-11 of PMD layer 120, and metal contact structure 125-21 extends vertically downward from metal line structure 130-2 through a (second) reserved region 120-21 of PMD layer 120. Referring to FIG. 3, in a similar manner, reserved regions 120-12, 120-13, 120-22 and 120-23 are designated for portions of PMD layer 120 through which contact structure 125-12, 125-13, 125-22 and 125-23 respectively extend. Referring again to FIG. 1, metal via structure 145-11 extends vertically upward from metal line structure 130-1 through a corresponding reserved region 140-11 of dielectric layer 140, and metal via structure 145-21 extends upward from metal line structure 130-2 through a corresponding reserved region 140-21 of dielectric layer 140, and as indicated in FIG. 3, reserved regions 120-12, 120-13, 120-22 and 120-23 are also designated for portions of dielectric layer 140 through which via structure 145-12, 145-13, 145-22 and 145-23 respectively extend. For example, as indicated in FIG. 1, each of low-k features 150-1 to 150-3 is entirely disposed within a (third) interstitial region 160, which in turn is located entirely between (i.e., does not overlap) adjacent reserved regions of each dielectric layer. In the depicted embodiment, interstitial region 160 includes region 120-31 of dielectric layer 120, region 140-31 of dielectric layer 140, and may include dielectric material regions above dielectric layer 140 (provided those regions do not coincide with a reserved region). In this example, interstitial region portion 120-31 is located between reserved regions 120-11 and 120-21, and interstitial region portion 140-31 is located between reserved regions 140-11 and 140-21. Similarly, as indicated in FIG. 3, all other portions of interstitial region 160 are disposed between two adjacent reserved regions, thereby forming elongated interstitial region portions that extend both parallel to polysilicon gate structure 110 (i.e., in the indicated Y-axis direction) and perpendicular to the polysilicon gate structure 110 (i.e., in the indicated X-axis direction). Note that this arrangement necessarily means that low-k features 150-1 to 150-3 are separated from metal contact structures 125-11 and 125-21 and from metal via structures 145-11 and 145-21 by corresponding intervening portions of the dielectric material forming dielectric layers 120 and 140. Referring to FIG. 1, by replacing portions of the dielectric material that would otherwise be disposed in interstitial region 160 with low-k features 150-1 to 150-3, the present invention provides significant improvement in the operating characteristics of RF SOI switch 100 by way of reducing capacitive coupling $C_{MM}$ between adjacent metal line structures 130-1 and 130-2 and/or capacitive coupling $C_{MP}$ between metal line structures 130-1 or 130-2 and polysilicon gate structures 110.

FIG. 2 is a flow diagram showing a generalized methodology for producing RF SOI switch 100 (shown in FIGS. 1 and 3), and FIGS. 4(A) to 4(E) and 5(A) to 5(E) depict associated processes performed during the production method.

Figure 4A:
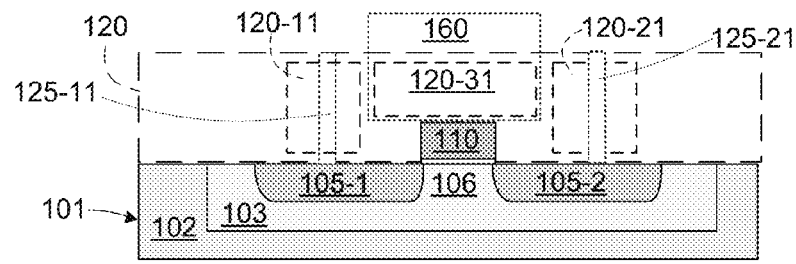
FIGS. 4(A), 4(B), 4(C), 4(D) and 4(E) are cross-sectional side views showing fabrication of generalized low-k features in a PMD layer according to an exemplary embodiment of the present invention.
Figure 5A:
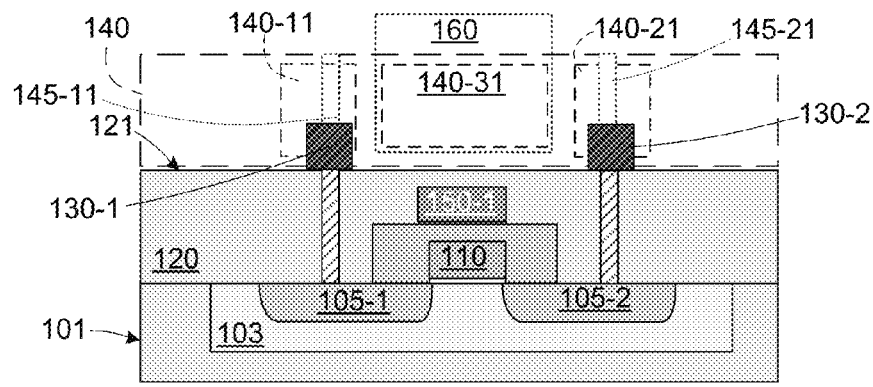
FIGS. 5(A), 5(B), 5(C) and 5(D) are cross-sectional side views showing fabrication of generalized low-k features in a first inter-metal dielectric layer according to another exemplary embodiment of the present invention.

As mentioned above, low-k features 150-1 to 150-3 are formed in predetermined interstitial region 160 prior to formation of at least one of dielectric layers 120 and 140. To assure that low-k features 150-1 to 150-3 do not affect the subsequent formation of metal contact or via structures, according to one embodiment, the dielectric layer regions through which all metal contact/via structures extend are identified prior to beginning the fabrication flow, and reserved regions are designated for each of these dielectric layer regions. Based on the predetermined reserved region locations, one or more interstitial regions are designated for one or more of dielectric layers 120 and 140. By way of example, FIG. 4(A) depicts substrate 101 and associated front-end structures of RF SOI switch 100, and indicates the assigned locations of contact structures 125-11 and 125-21 in PMD layer 120. To assure that low-k feature 150-1 does not affect the subsequent formation of contact structures 125-11 and 125-21, reserved regions 120-11 and 120-21 are respectively designated in PMD layer 120, and then portion 120-31 of interstitial region 160 is designated between reserved regions 120-11 and 120-21. Similarly, FIG. 5(A) depicts partially formed SOI switch 100 after PMD layer 120 and metal line structures 130-1 and 130-2 are formed, and indicates the assigned locations of metal via structures 145-11 and 145-21 in first inter-metal dielectric layer 140. To assure that low-k feature 150-2 does not affect the subsequent formation of metal via structures 145-11 and 145-21, reserved regions 140-11 and 140-21 are respectively designated in layer 140, and then portion 140-31 of interstitial region 160 is designated between reserved regions 140-11 and 140-21.

Referring to block 205 of FIG. 2, and referencing the structures shown in FIG. 4(A), the production of switch 100 begins by performing front-end processes of an established CMOS, BiCMOS or RF MEMS fabrication flow to fabricate spaced-apart source/drain regions 105-1 and 105-2 in silicon island 103, and forming polysilicon gate structure 110 over channel region 106. As explained below with reference to FIGS. 4(B) to 4(E) and 5(B) to 5(D), the subsequent processes indicated by blocks 210 to 230 of FIG. 2 are performed during the subsequent fabrication processes associated with the formation of one or more dielectric layers. That is, the processes of blocks 210 to 230 are performed for each dielectric layer in which one or more low-k features are formed in accordance with the present invention.

Figure 4B:
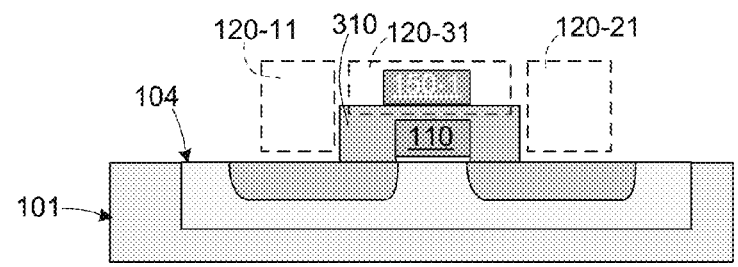
Figure 5B:
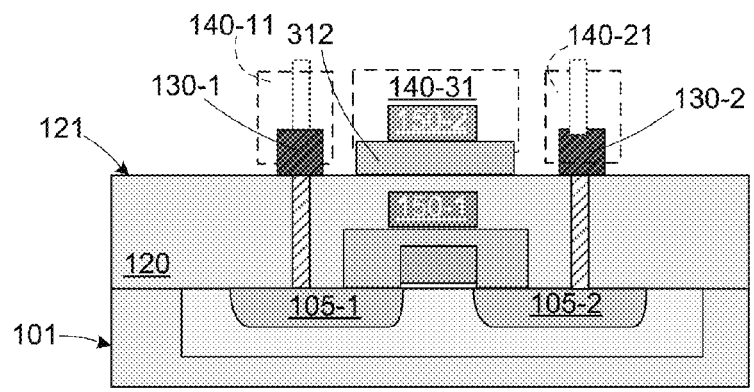

Referring to block 210 of FIG. 2, prior to or during the formation of a given dielectric layer, one or more low-k features are formed in predetermined corresponding interstitial regions over all previously formed structures. For example, as indicated in FIG. 4(B), low-k feature 150-1 is formed in corresponding interstitial region 120-31 over polysilicon gate structure 110 and over/between source/drain regions 105-1 and 105-2. Note again that low-k feature 150-1 is disposed entirely between designated reserved regions 120-11 and 120-21 of to-be-formed PMD layer 120. In one embodiment, a passivation layer 310 is deposited on upper surface 104 prior to the formation of low-k feature 150. Referring to FIG. 5(B), block 220 also refers to the formation of low-k feature 150-2 in corresponding interstitial region 140-31, which is also located over polysilicon gate structure 110, but in this case is also located over previously formed PMD layer 120 and between metal line structures 130-1 and 130-2, with low-k feature 150-2 disposed on a passivation layer 310 and entirely disposed between designated reserved regions 140-11 and 140-21 of to-be-formed dielectric layer 140.

Figure 4C:
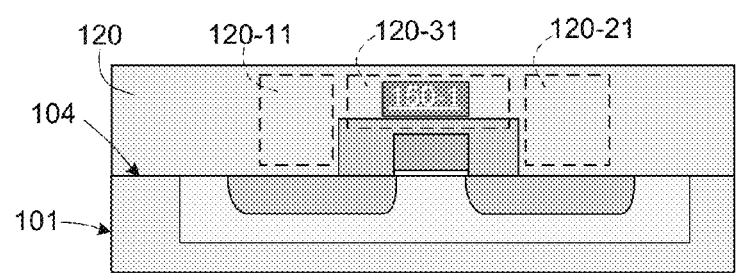
Figure 5C:
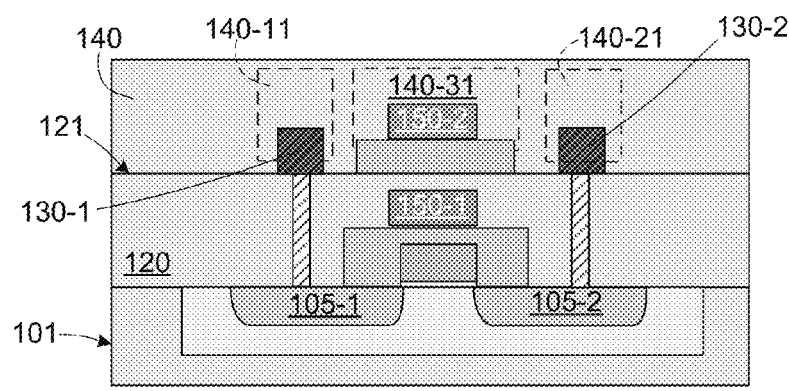

Referring to block 220 of FIG. 2, after the low-k features associated with a given dielectric layer are formed, suitable dielectric materials (e.g., $SiO_2$) are deposited over the existing structures in accordance with standard processing techniques to complete the dielectric layer. For example, FIG. 4(C) depicts the partially formed RF SOI structure after dielectric material is deposited over upper surface 104 of substrate 101, thereby forming PMD layer 120. Note that portions of the dielectric material occupy reserved regions 120-11 and 120-21 disposed on opposite sides of interstitial region portion 120-31, and that no part of low-k feature 150-1 encroaches into either of reserved regions 120-11 and 120-21. In a second example depicting the process of block 220, FIG. 5(C) depicts the partially formed RF SOI structure after dielectric material is deposited over upper surface 121 of PMD layer 1120, thereby forming first inter-metal dielectric layer 140, with portions of the dielectric material occupying reserved regions 140-11 and 140-21 on opposite sides of interstitial region portion 140-31 (i.e., such that dielectric material is disposed between low-k feature 150-2 and reserved regions 140-11 and 140-21.

Figure 4D:
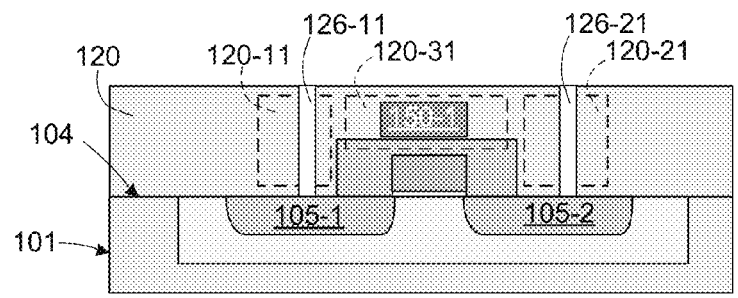
Figure 4E:
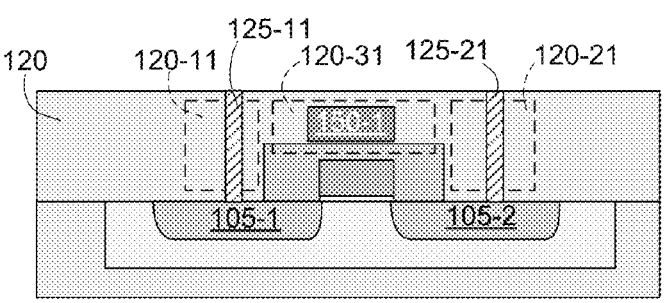
Figure 5D:
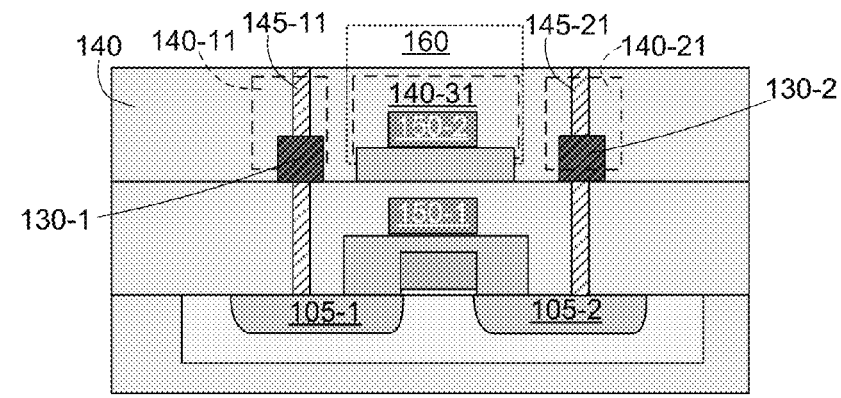

Referring to block 230 of FIG. 2, after each associated dielectric layer is formed, metal contact/via structures are then formed through the dielectric layer only in the reserved regions. For example, FIG. 4(D) depicts the partially formed RF SOI structure after contact openings 126-11 and 126-21 are etched through reserved regions 120-11 and 120-21 of dielectric layer 120 to upper surface 104 of substrate 101 over source/drain regions 105-1 and 105-2, respectively. Next, as indicated in FIG. 4(E), metal contacts 125-11 and 125-21 are formed in the contact openings top provide electrical contact to source/drain regions 105-1 and 105-2, respectively. By locating low-k feature 150-1 away from contact structures 125-11 and 125-12, the methodologies of the present invention avoid changes to the established contact etch and formation processes because the etch process is performed through the same all-dielectric-material environment that is encountered in the established fabrication flow, whereby reliability and yield of the established fabrication flow are substantially maintained. In a second example depicting the process of block 230, FIG. 5(D) depicts the partially formed RF SOI structure after via openings have been etched and metal via structures 145-11 and 145-21 have been formed through dielectric layer 140, thereby contacts to metal line structures 130-1 and 130-2, respectively. As in PMD layer 120, periodically spaced metal via structures 145-11 and 145-12 are entirely surrounded by dielectric material deposited into reserved regions 140-11 and 140-21, respectively, whereby the associated etch process (not depicted) encounters the same all-dielectric-material environment that is encountered in the established fabrication flow during via formation.

Referring again to FIG. 1, RF SOI switch 100 optionally includes one or more additional low-k features 150-3 formed in dielectric layers located above first-metal dielectric layer 140 using the generalized approach described above. The present invention facilitates maximum reduction in $C_{off}$ operating characteristics of RF SOI switch 100 by way of maximizing the volume occupied by low-k features in each of the dielectric layers. However, significant improvement in $C_{off}$ operating characteristics may be achieved by way of introducing low-k features in only some or one of the dielectric layers. For example, the present inventors believe the most significant improvement is achieved by way of disposing low-k features in first-metal dielectric layer 140 (i.e., between Metal-1 line structures 130-1 and 130-2). Introducing the formation of low-k features in one or a small number of dielectric layers also minimizes changes to the fabrication flow, thereby facilitating significant improvement in operating characteristics of a currently-being-produced RF SOI switch at very little change to overall production costs.

The formation of low-k features according to the generalized methodology (block 210, FIG. 2) will now be described with reference to two alternative approaches, which are referred to herein as patterned approaches and self-aligned approaches. The patterned approaches are generally described with reference to FIG. 6, and various exemplary embodiments of patterned low-k features are described with reference to FIGS. 7(A) to 12(J). The self-aligned approach will then be described with reference to FIGS. 13 to 15(B). These two generalized approaches and exemplary embodiments described with reference to the figures are intended to be illustrative and not limiting unless otherwise specified in the appended claims.

Figure 6:
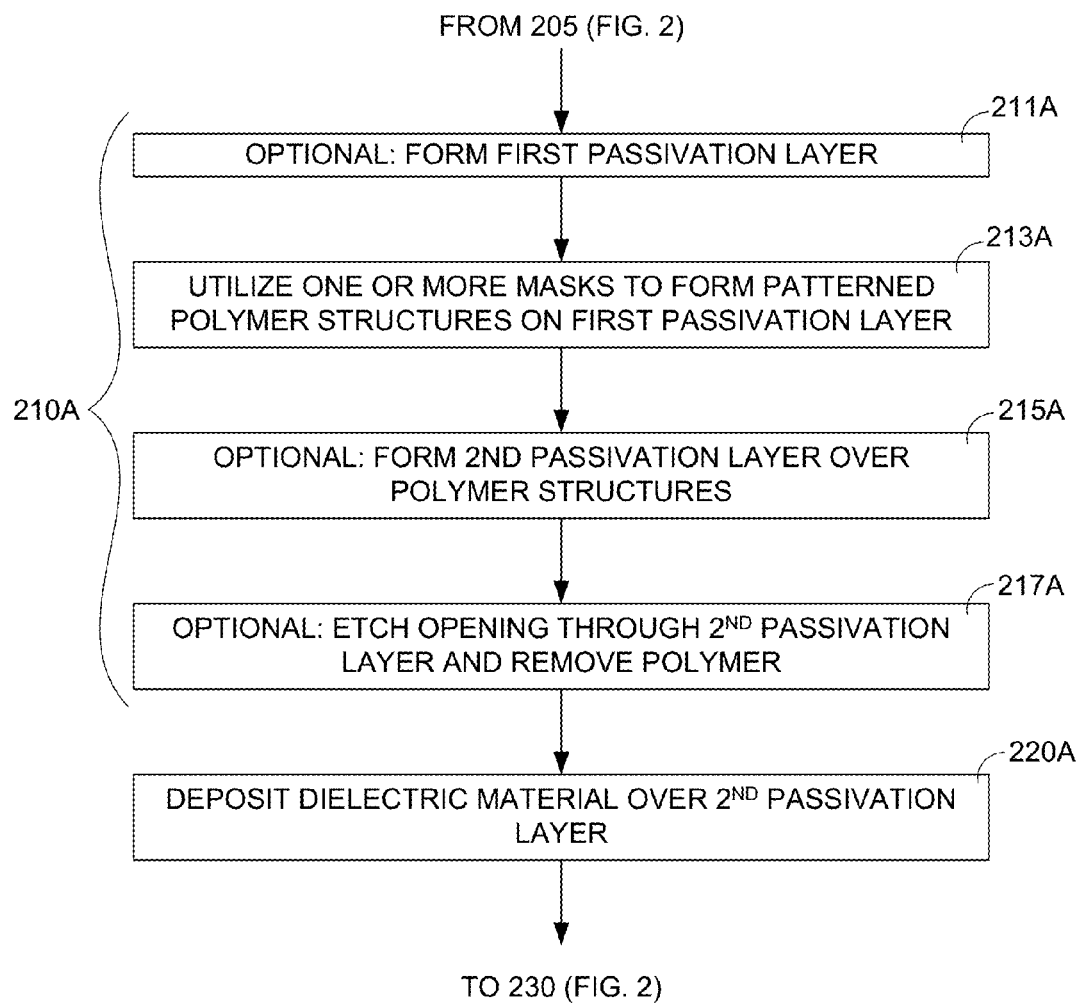
FIG. 6 is a flow diagram showing a method for generating patterned low-k features according to an embodiment of the present invention.

Referring to the top of FIG. 6, the patterned approach is performed after previous switch structures and/or any preceding dielectric layers are formed on an SOI substrate. For example, using RF SOI switch 100 of FIG. 1 for reference, the patterned approach may be performed between the formation of polysilicon gate structure 110 and before the completion of PMD layer 120, may be formed after formation of metal line structures 130-1 and 130-2 on PMD layer 120, and/or may be performed in one or more dielectric layers formed above first-metal dielectric layer 140. The specific processes corresponding to the formation of patterned low-k features are collectively identified by reference number 210A in FIG. 6 (which corresponds to block 210 of FIG. 2).

Referring to block 211A at the top of FIG. 6, an optional first passivation layer (e.g., silicon dioxide—SiO$_2$) is disposed over the previously formed structures, then one or more masks (reticles) are utilized to form one or more patterned polymer structures on the first passivation layer (see block 213A of FIG. 6), and then an optional second passivation layer is disposed over the patterned polysilicon structures (block 215A of FIG. 6). As explained in further detail below, the optional passivation layers formed in blocks 211A and 215A are utilized in void-type low-k feature embodiments to prevent leakage of adjacent interconnect, and decrease the permittivity between the metal or semiconductor materials in their vicinity. Referring to block 217A, when void-type low-k features are desired, optional openings are etched through the second (upper) passivation layer to expose the patterned polymer structures, and then the polymer structures are removed from between the passivation layers to generate (define) void regions when void-type low-k features are formed. Note that one or both of the optional passivation layers may also be utilized in some embodiments in which the patterned polymer structures are retained in (i.e., form part of) the final low-k features to minimize potential problems that may arise due to the deposition of polymer material directly on underlying structures, and/or to prevent possible problems during subsequent dielectric material deposition by way of providing a more normalized environment. In other embodiments in which the patterned polymer structures are retained, the passivation layers formed in blocks 211A and 215A may be omitted. As indicated in block 220A at the bottom of FIG. 6, in any case, after the desired low-k feature is completed, dielectric material is then deposited either over the upper (second) passivation layer, or directly on the patterned polymer structure (i.e., when the second passivation layer is omitted).

Figure 7A:
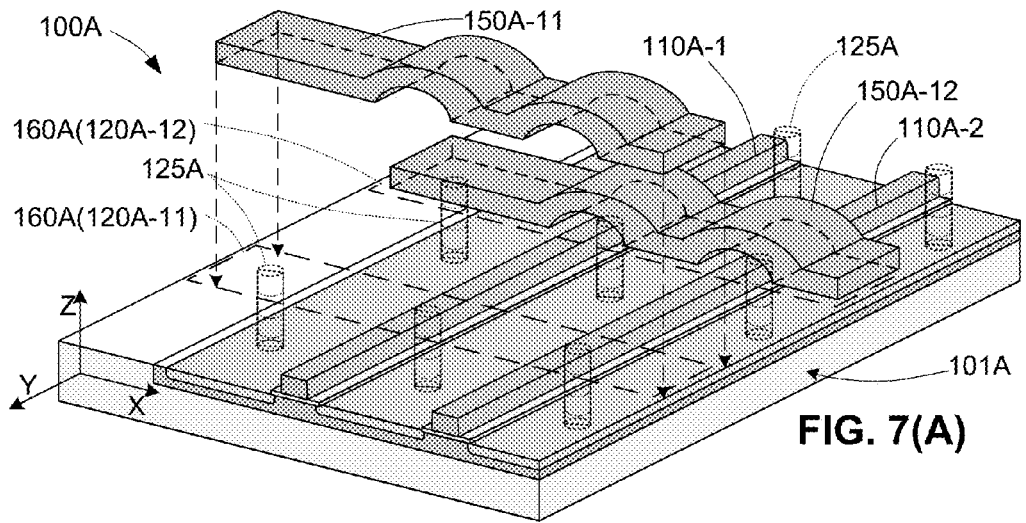
FIGS. 7(A), 7(B) and 7(C) are perspective views showing the formation of patterned low-k features extending perpendicular to the polysilicon gate structures according to an exemplary specific embodiment.
Figure 7B:
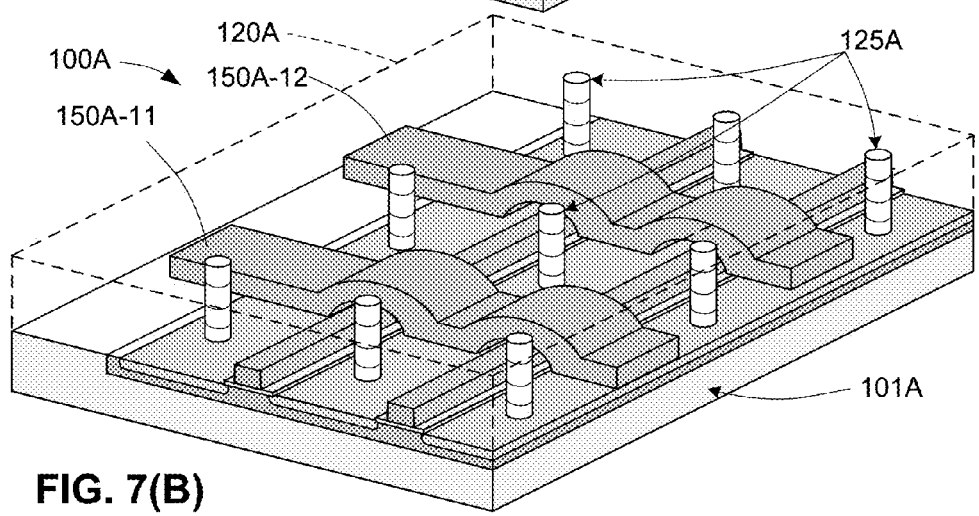
Figure 7C:
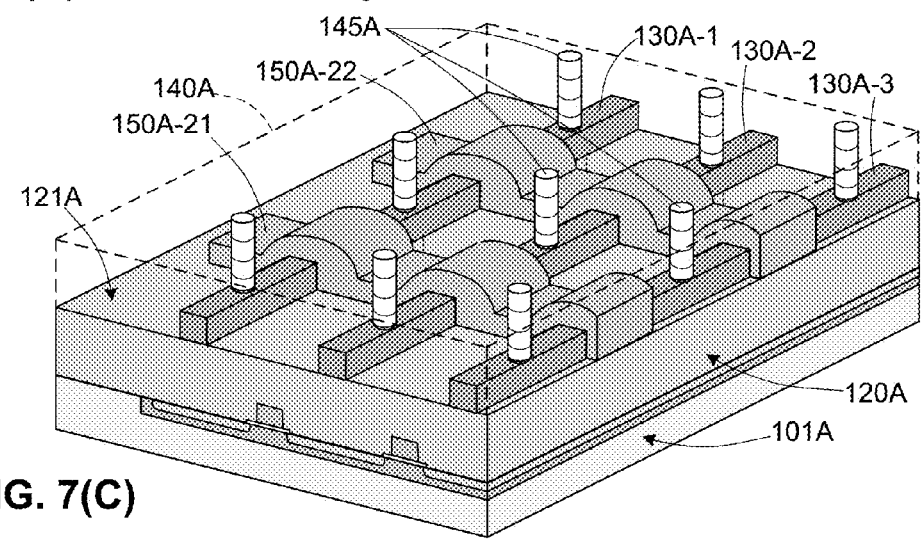

FIGS. 7(A) to 7(C) are perspective views showing an RF SOI switch 100A including elongated patterned low-k features extending perpendicular to polysilicon gate structures 110A-1 and 110A-2 according to a first exemplary embodiment. Referring to FIG. 7(A), gate structures 110A-1 and 110A-2 are formed on SOI substrate 101A in the manner described above, and extend parallel to the Y-axis direction. As indicated in FIGS. 7(A) and 7(B), parallel elongated low-k features 150A-11 and 150A-12 are respectively disposed in elongated associated portions 120A-11 and 120A-12 of interstitial region 160A extending perpendicular to gate structures 110A-1 and 110A-2 (i.e., in the X-axis direction). With this arrangement, portions of each low-k feature 150A-11 and 150A-12 extend over gate structures 110A-1 and 110A-2, and other portions are disposed in regions between gate structures 110A-1 and 110A-2. As in the previous embodiments, interstitial region portions 120A-11 and 120A-12 are disposed between rows of metal contact structures 125A aligned in the X-axis direction, which extend through corresponding reserved regions of dielectric layer 120A such that each metal contact structure 125A is entirely surrounded by the dielectric material forming PMD layer 120A. Similarly, as indicated in FIG. 7(C), parallel elongated low-k features 150A-21 and 150A-22 disposed in first-metal dielectric layer 140A also extend in the X-axis direction between rows of metal via structures 145A, with portions of each low-k feature 150A-21 and 150A-22 extending over metal line structures 130A-1 to 130A-3, and other portions are disposed on upper surface 121A of PMD layer 120A in regions between the metal line structures, where each metal via structure 145A is entirely surrounded by the dielectric material forming first-metal dielectric layer 140A. In some instances it may be necessary to remove some contact structures 125A and/or some via structures 145A to provide sufficiently large interstitial regions for patterned low-k features 150A-11 and 150A-12 and/or 150A-21 and 150A-22, but such contact/via structure modifications are typically relatively easy to accommodate with little to increase in $R_{on}$.

Figure 8A:
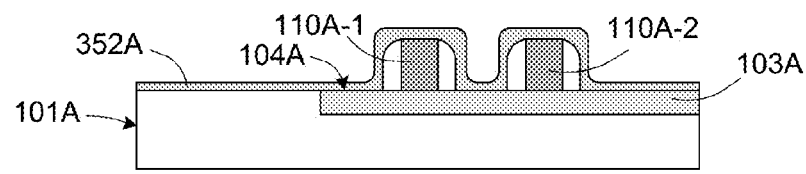
FIGS. 8(A), 8(B), 8(C), 8(D) and 8(E) are cross-sectional side views showing the production of polymer-structure-type low-k features according to an exemplary embodiment.
Figure 8B:
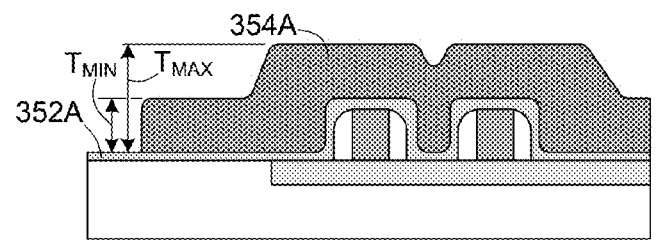

FIGS. 8(A) to 8(E) are simplified cross-sectional side views depicting the fabrication of an RF SOI switch including polymer-structure-type low-k features according to an exemplary embodiment in which the low-k features are generated as elongated low-k features similar to those shown in FIGS. 7(A) to 7(C). Note that that the description of only one low-k feature is described and some details of the switch structure are omitted for clarity. Referring to FIG. 8(A), after polysilicon gate structures 110A-1 and 110A-2 are formed on upper surface 104A of active region 103A, a lower passivation layer 352A is formed over substrate 101A. Next, as indicated in FIG. 8(B), a patterned polymer structure 354A is formed on lower passivation layer 352A. In alternative specific embodiments, patterned polymer structures 354A are formed using either direct polymer patterning techniques, an oxide layer or other hard mask, or a resist that selectively removes portions of a polymer layer, all of which being known in the art. Because polymer structure 354A is retained to form part of the final low-k feature, polymer structures 354A comprise a low-k polymer material such as polyimide, polynorbornene, benzocyclobutene or PTFE, which are known to have lower dielectric constant values than standard dielectric materials (e.g., $SiO_2$). In an exemplary embodiment, polymer structure 354A is formed with a minimum thickness of approximately 4000 Angstroms (4000 A), and a maximum thickness $T_{MAX}$ of approximately 8000 A.

Figure 8C:
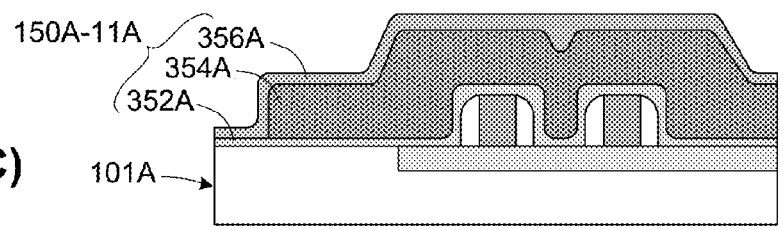
Figure 8D:
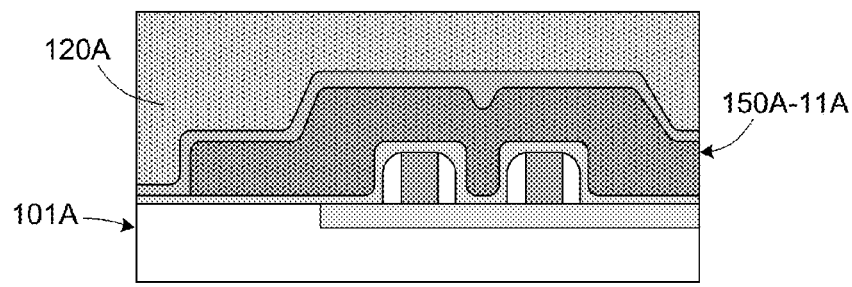
Figure 8E:
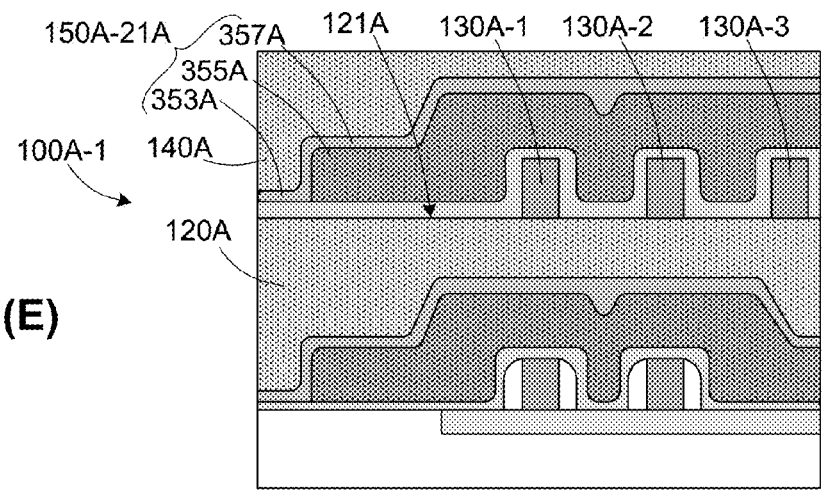

Referring to FIG. 8(C), an upper passivation layer 356A is then formed over patterned polymer structure 354A and all remaining exposed portions of lower polymer layer 352A, thereby completing polymer-structure-type low-k feature 150A-11A. Finally, as indicated in FIG. 8(D), dielectric material is deposited over polymer-structure-type low-k feature 150A-11A and all remaining exposed portions of upper polymer layer 356A, and then contact formation is performed as described above. Subsequently, as indicated in FIG. 8(E), the low-k features disposed in the first-metal dielectric layer (e.g., a polymer-structure-type low-k feature 150A-21A) are formed by way of depositing a lower passivation layer 353A on upper PMD surface 121A, forming patterned polymer structures 355A, and forming upper passivation layer 357A in the manner described above. A dielectric material is then deposited and processed as described above to generate first-metal dielectric layer 140A of RF SOI switch 100A-1.

Figure 9A:
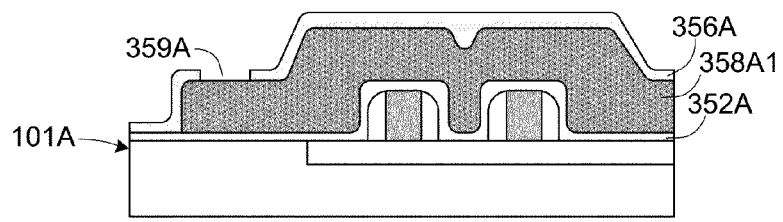
FIGS. 9(A), 9(B), 9(C) and 9(D) are cross-sectional side views showing the production of void-type low-k features according to another exemplary embodiment.
Figure 9B:
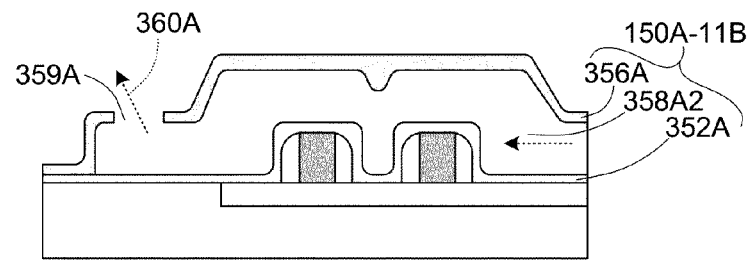
Figure 9C:
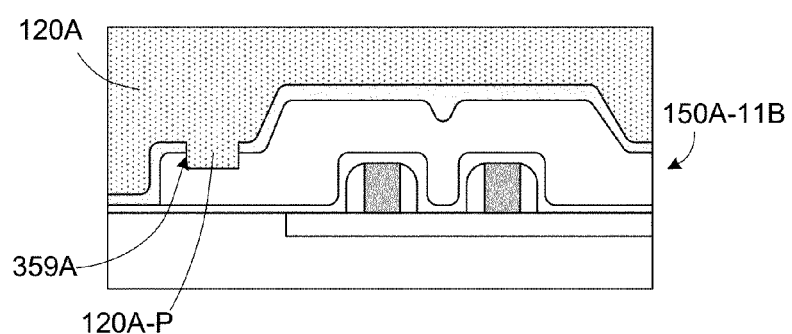
Figure 9D:
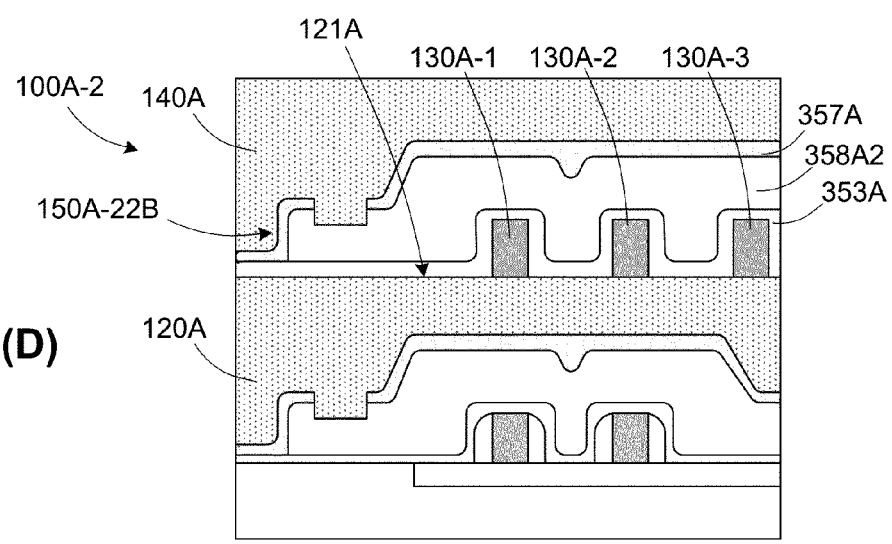

FIGS. 9(A) to 9(D) are simplified cross-sectional side views depicting the fabrication of an RF SOI switch including void-type low-k features according to another simplified exemplary embodiment. Referring to FIG. 9(A), a sandwich structure including an upper passivation layer 356A formed over a patterned polymer structure 358A1 and exposed portions of a lower polymer layer 352A is generated in a manner similar to that described above with reference to FIG. 8(A) to 8(C). However, in this case, because the polymer structure 358Aa is subsequently removed to form part of the final low-k feature, polymer structures 358A1 is either a low-k polymer material mentioned above, or may be a higher-k polymer material. In addition, as indicated in FIG. 9(A), at least one opening 359A is etched into upper passivation layer 356A, and the (as indicated in FIG. 9(B)), the polymer material is removed from between passivation layers 352A and 356A (e.g., ashed out using oxygen plasma), thereby generating a void region 358A2 between the upper passivation layer 356A and lower passivation layer 352A. As indicated in FIG. 9(C), subsequent deposition of dielectric material forming PMD layer 120A is performed such that portions 120A-P of the dielectric material to plug opening 359A, thereby completing void-type low-k feature 150A-11B. Depending on the process conditions utilized during the asking and subsequent dielectric deposition processes, void region 358A2 is either gas-filled or vacuum-filled. In either case, void-type low-k feature 150A-11B has a lower dielectric constant than standard dielectric materials used to form PMD layer 120A. Subsequently, as indicated in FIG. 9(D), the low-k features disposed in the first-metal dielectric layer (e.g., a void-type low-k feature 150A-21B) are formed by way of depositing a lower passivation layer 353A on upper PMD surface 121A, forming a patterned polymer structures, forming upper passivation layer 357A in the manner described above, etching and opening and removing the polymer material, and then depositing dielectric material to form first-metal dielectric layer 140A, thereby substantially completing RF SOI switch 100A-2.

Figure 10A:
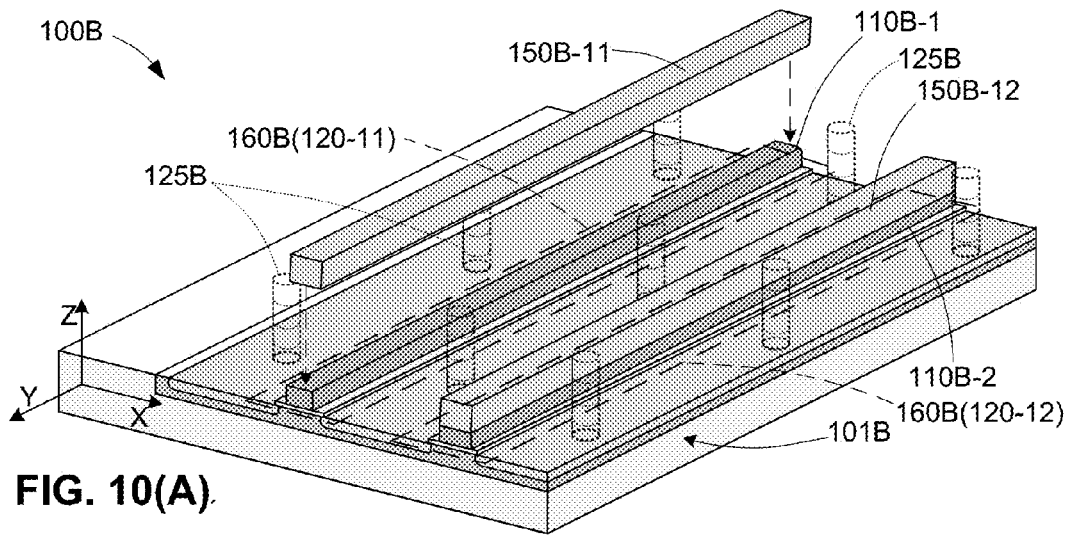
FIGS. 10(A), 10(B) and 10(C) are perspective views showing the formation of patterned low-k features extending parallel to the polysilicon gate structures according to an exemplary specific embodiment.
Figure 10B:
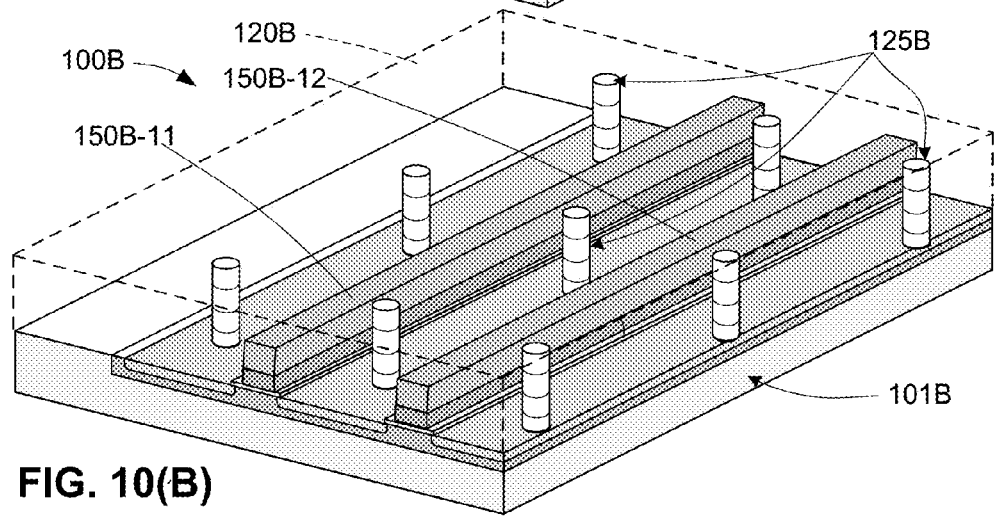
Figure 10C:
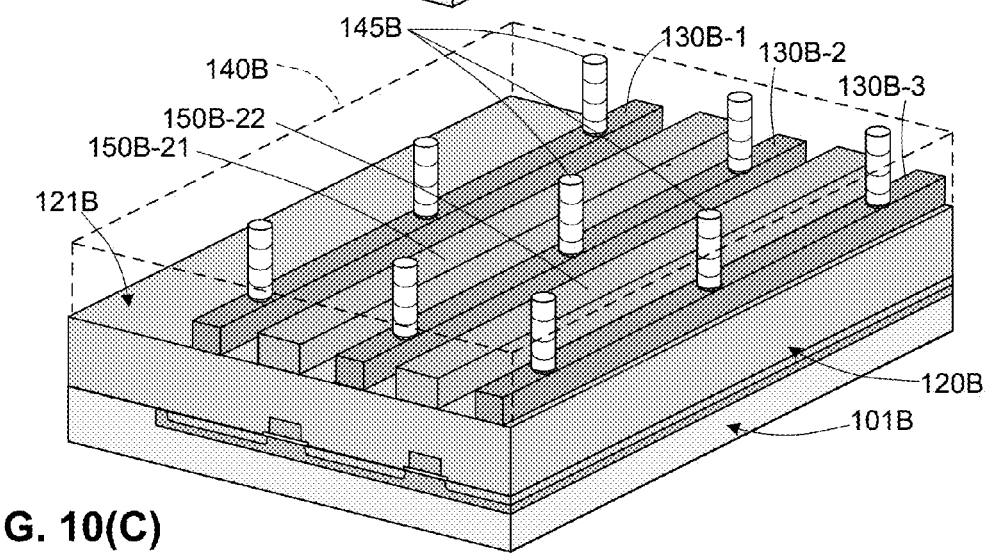

FIGS. 10(A) to 10(C) are perspective views showing an RF SOI switch 100B including elongated patterned low-k features according to a second exemplary embodiment in which the low-k features extend perpendicular to polysilicon gate structures 110B-1 and 110B-2, which are formed on substrate 101B and extend parallel to the Y-axis direction as indicated in FIG. 10(A). As indicated in FIGS. 10(A) and 10(B), parallel elongated low-k features 150B-11 and 150B-12 are respectively disposed in elongated associated portions 120B-11 and 120B-12 of interstitial region 160B, and extend parallel to gate structures 110B-1 and 110B-2 (i.e., in the Y-axis direction). With this arrangement, the entirety of each low-k feature 150B-11 and 150B-12 is disposed over gate structures 110B-1 and 110B-2. As in the previous embodiments, interstitial region portions 120B-11 and 120B-12 are disposed between columns of metal contact structures 125B aligned in the Y-axis direction, which extend through corresponding reserved regions of dielectric layer 120B. Similarly, as indicated in FIG. 10(C), parallel elongated low-k features 150B-21 and 150B-22 disposed in first-metal dielectric layer 140B also extend in the Y-axis direction between columns of metal via structures 145B, with low-k feature 150B-21 disposed on upper PMD surface 121B between metal line structures 130B-1 and 130B-2, and low-k feature 150B-22 disposed between metal line structures 130B-2 and 130B-3. Because metal via structures 145B extend upward from metal line structures 130B-1 to 130B-3, each metal via structure 145B is entirely surrounded by the dielectric material forming first-metal dielectric layer 140B. Note that this approach does not require a reduction in the number of contact/via structures, as required in the perpendicular approach described above with reference to FIGS. 7(A) to 7(C). Note also that low-k features 150B-11, 150B-12, 150B-21 and 150B-22 may be formed either as polymer-structure-type low-k features using methods similar to those described above with reference to FIGS. 8(A) to 8(E), or a void-type low-k features using methods similar to those described above with reference to FIGS. 9(A) to 9(D).

Figure 11A:
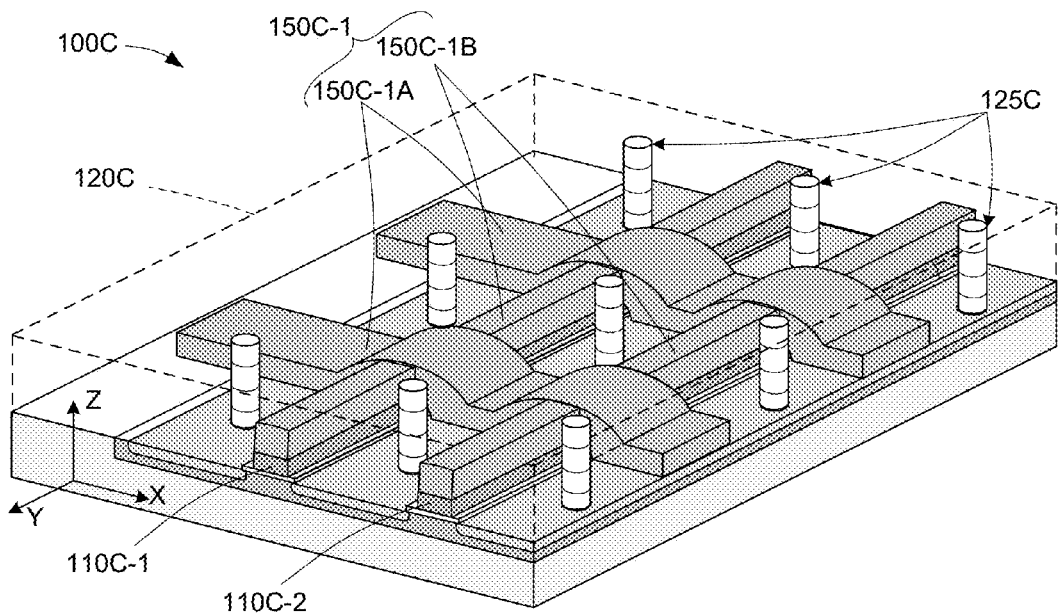
FIGS. 11(A) and 11(B) are perspective views showing the formation of patterned low-k features disposed in a mesh-type arrangement according to an exemplary specific embodiment.
Figure 11B:
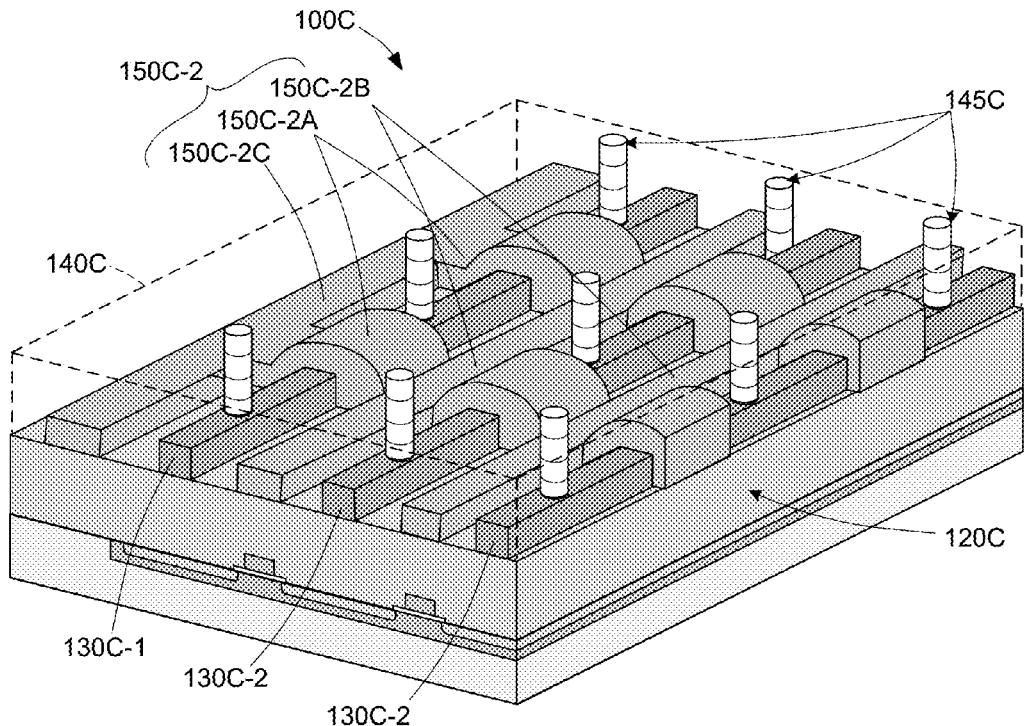

FIGS. 11(A) and 11(B) are perspective views showing an RF SOI switch 100C including elongated patterned low-k features 150C-1 and 150C-2 disposed in mesh-type patterns according to a third exemplary embodiment. As indicated in FIG. 11(A), low-k feature 150C-1 is disposed in PMD layer 120C and includes parallel portions 150C-1A extending in the X-axis direction in a manner similar to that described above with reference to FIG. 7(A), and parallel portions 150C-1B extending in the Y-axis direction over polysilicon gate structures 110C-1 and 110C-2, respectively, in a manner similar to that described above with reference to FIG. 10(A), where portions 150C-1A and 150C-1B are joined together at each intersection to form an integral feature (e.g., including an integral mesh-type polymer structure or a mesh-type void region). As in the previous embodiments, each portion 150C-1A and 150C-1B of low-k feature 150C-1 is disposed in a corresponding interstitial region portion such that metal contact structures 125C are entirely surrounded by dielectric material. Similarly, as indicated in FIG. 11(B), a mesh-type low-k feature 150C-2 includes parallel portions 150C-2A extending in the X-axis direction in a manner similar to that described above with reference to FIG. 7(C), and parallel portions 150C-2B extending in the Y-axis direction in a manner similar to that described above with reference to FIG. 10(C), with portions 150C-2A and 150C-2B joined together at each intersection. In addition, low-k feature 150C-2 includes an end portion 150C-2C that is connected to ends of portions 150C-2B and arranged parallel to portions 150C-2B. As described below with reference to FIGS. 12(A) to 12(J), end portion 150C-2C is utilized to form etch holes through which polymer material is removed when low-k feature 150C-2 is implemented as a void-type low-k feature.

FIGS. 12(A) to 12(J) are simplified top views depicting the fabrication of a RF SOI switch including patterned mesh-shaped low-k features similar to those described above with reference to switch 100C (see FIGS. 11(A) and 11(B)). Although the RF SOI switch depicted in FIGS. 12(A) to 12(J) is not a complete switch structure, the RF SOI switch is more representative of RF SOI switches generated in accordance with the present invention. Structures of the depicted switch that are similar to switch 100C are identified with similar reference numbers.

Figure 12A:
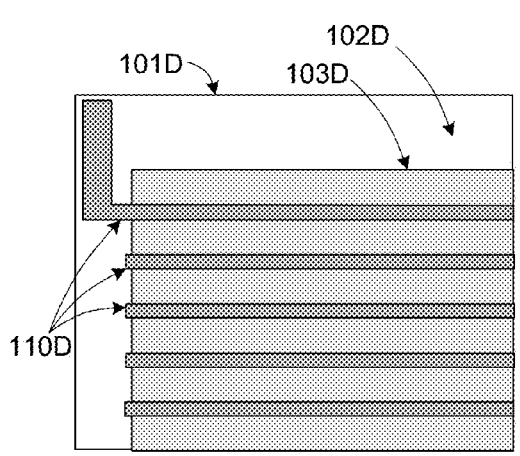

FIG. 12(A) is a top view showing a corner of an SOI substrate 101D including silicon island 103D. Polysilicon structures 110D-1 are patterned over oxide portion 102D and extend in parallel (horizontal) rows over silicon island 103D. Source/drain regions (not shown) are formed in silicon island 103D between adjacent polysilicon structures 110D-1.

Figure 12B:
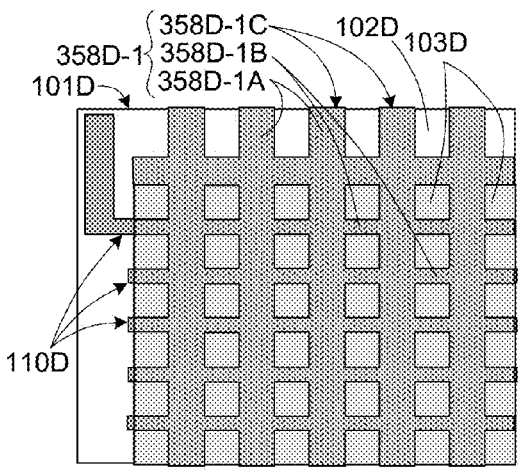

FIG. 12(B) depicts the formation of patterned mesh-type polymer layer 358D-1 over substrate 101D. Polymer layer 358D-1 is formed in a manner similar to that of layer 358A1 (described above with reference to FIG. 9(A)), and is patterned in a manner similar to that of switch 100C (see FIG. 11(A)). Specifically, polymer layer 358D-1 includes elongated sections 358D-1A that extend vertically over silicon island 103D, and elongated sections 358D-1B extending horizontally over portions of polysilicon gate structures 110D disposed over silicon island 103D. In addition, polymer layer 358D-1 includes end sections 358D-1C that extend from elongated vertical sections 358D-1A over oxide portion 102D of substrate 101D. End sections 358D-1C provide structures for removing polymer material in void-type low-k feature applications, and may be omitted in polymer-structure-type low-k feature applications.

Figure 12C:
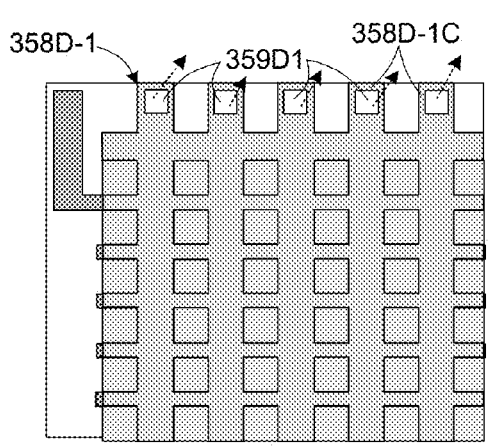

FIG. 12(C) depicts the formation of etched openings 359D1 in an upper passivation layer (not shown) over end sections 358D-1C of polymer layer 358D-1, and the subsequent asking of polymer material in the manner described above with reference to FIG. 9(B), thereby creating void regions under the upper passivation layer.

Figure 12D:
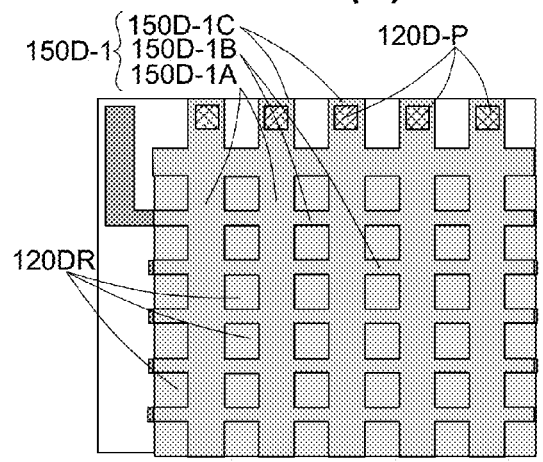

FIG. 12(D) depicts the partial switch structure after dielectric material has been deposited that forms plugs 120D-P in the etched openings and forms a PMD layer (not shown) in the manner described above with reference to FIG. 9(C). At this point, mesh-type void-type low-k feature 150D-1 is completed, including parallel vertical portions 150D-1A, horizontal portions 150D-1B, and end portions 150D-1C. Note that all of these portions are formed in designated interstitial regions, and that designated reserved regions 120DR are disposed in the openings defined between the horizontal and vertical portions forming the mesh-type arrangement.

Figure 12E:
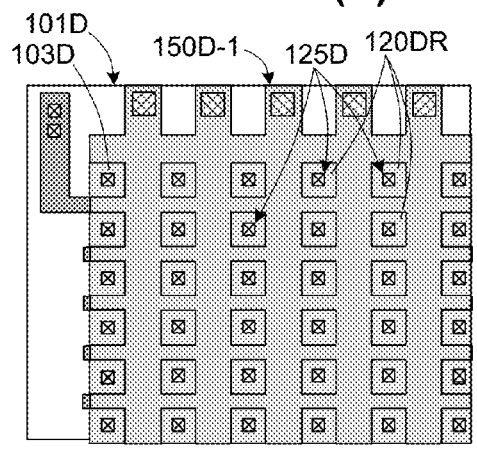

FIG. 12(E) depicts the subsequent formation of metal contact structures 125D through the dielectric material forming the PMD layer, with each contact structure 125D that is formed over silicon island 103D disposed in a corresponding reserved region 120DR. As mentioned above, metal contact structures 125D are simultaneously formed over the entirety of SOI substrate 101D using the same the same contact formation process.

Figure 12F:
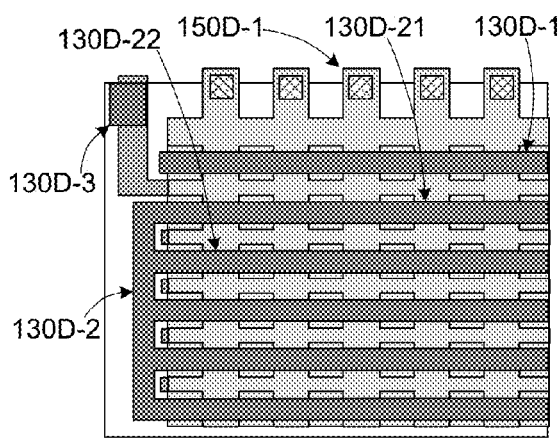

FIG. 12(F) depicts the subsequent formation of first-metal structures over the PMD layer, including an end structure 130D-1, a multi-part structure 130D-2, and a terminal structure 130D-3, with each of these structures being contacted on their lower side by associated metal contact structures 125D (shown in FIG. 12(E)). For reasons known in the art, multi-part structure 130D-2 includes multiple parallel finger-like line structures (e.g., 130D-21 and 130D-22) that are electrically connected together at one end to apply a common voltage to the channel regions separating corresponding source/drain regions.

FIG. 12(G) depicts the partially formed switch structure after the formation of a second (upper) patterned mesh-type polymer layer 358D-2 over the PMD layer. Polymer layer 358D-2 is formed in a manner similar to that described above, and includes elongated sections 358D-2A that extend vertically over sections of end structure 130D-1 and the finger-like line structures of multi-part structure 130D-2, and elongated horizontal sections 358D-2B extending over horizontal low-k feature portions 150D-1B in a manner similar to that depicted above in FIG. 11(B). In addition, polymer layer 358D-2 includes an enlarged end section 358D-2C that is attached to upper ends of elongated vertical sections 358D-2A, and is disposed over oxide portion 102D of substrate 101D. End section 358D-2C is formed with a substantially larger width $W_{358D-2C}$ than widths $W_{358D-2B}$ of horizontal sections 358D-2B for purposes of facilitating larger etched openings (release holes) to facilitate more efficient removal of polymer material in void-type low-k feature applications.

FIG. 12(H) depicts the formation of etched openings 359D2 in an upper passivation layer (not shown) over end section 358D-2C, and the subsequent asking (removal) of polymer material (indicated by dashed-line arrows) using oxygen plasma, thereby creating void regions under the upper passivation layer.

FIG. 12(I) depicts the partial switch structure after dielectric material has been deposited that forms plugs 140D-P in the etched openings and forms first-metal dielectric layer (not shown) in the manner described above with reference to FIG. 9(D). At this point, mesh-type void-type low-k feature 150D-2 is completed, including parallel vertical portions 150D-2A, horizontal portions 150D-2B, and end portion 150D-2C. Note again that all portions of low-k feature 150D-2 are formed in designated interstitial regions.

FIG. 12(J) shows substantially complete RF SOI switch 100D after the formation of metal via structures 145D through the dielectric material forming the first-metal dielectric layer, with each contact structure 145D being contacted at its lower end to a corresponding metal structure.

Figure 13:
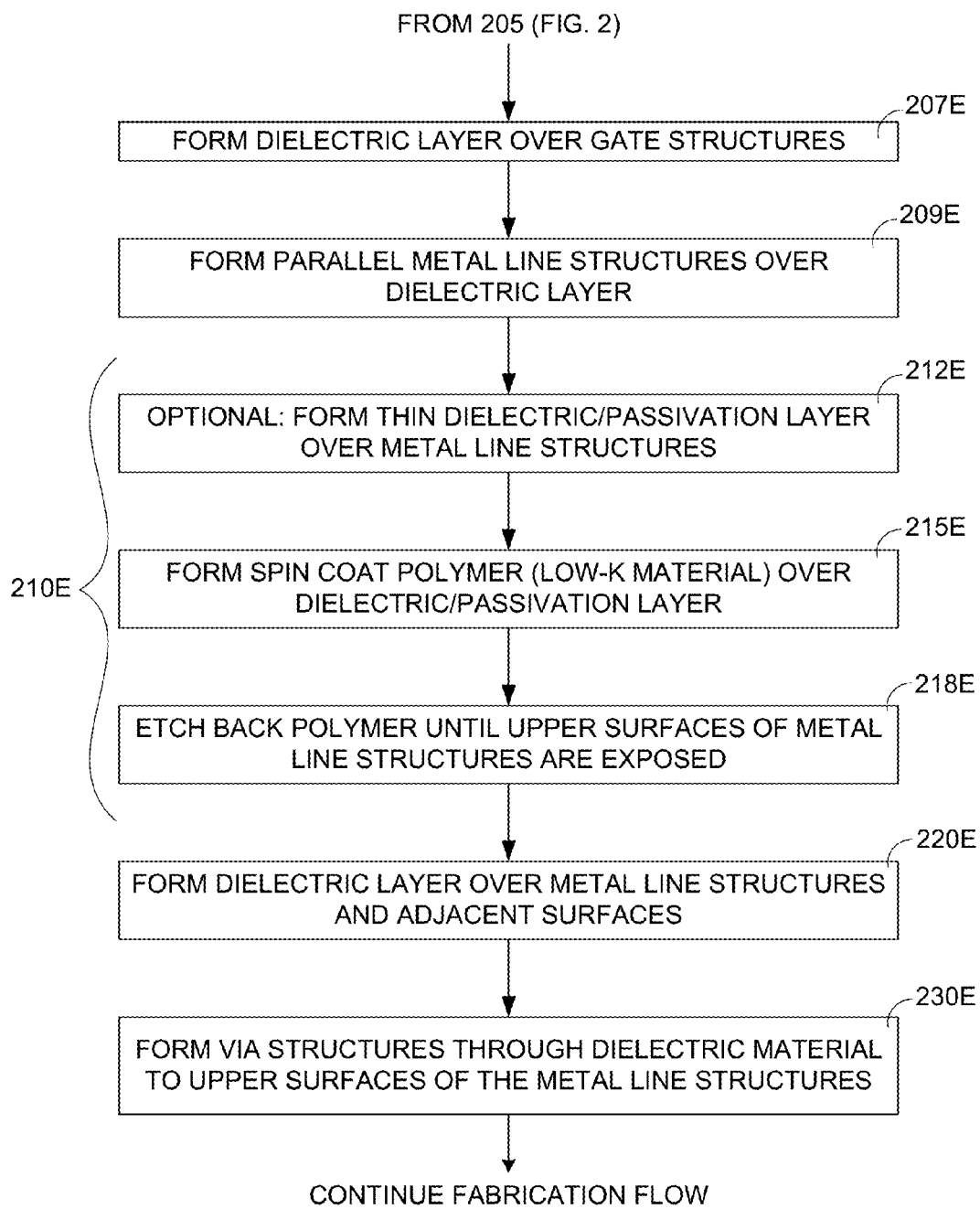
FIG. 13 is a flow diagram showing a method for generating self-aligned low-k features according to another embodiment of the present invention.
Figure 14A:
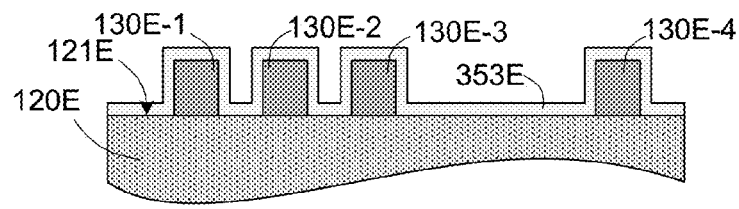
FIGS. 14(A), 14(B), 14(C), 14(D), 14(E) and 14(F) are cross-sectional side views showing the production of self-aligned polymer-structure-type low-k features according to another exemplary embodiment.
Figure 14B:
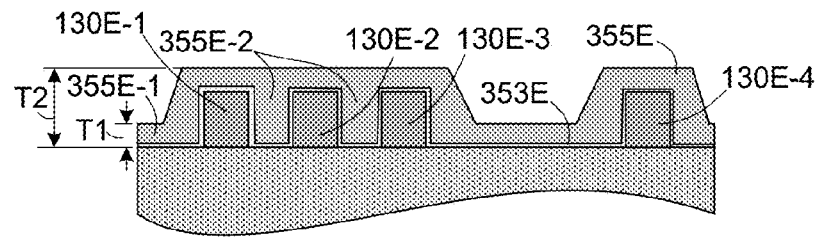
Figure 14C:
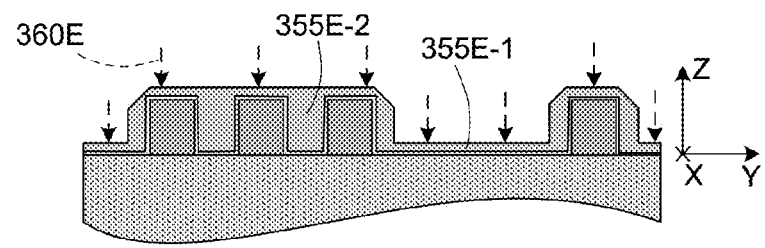
Figure 14D:
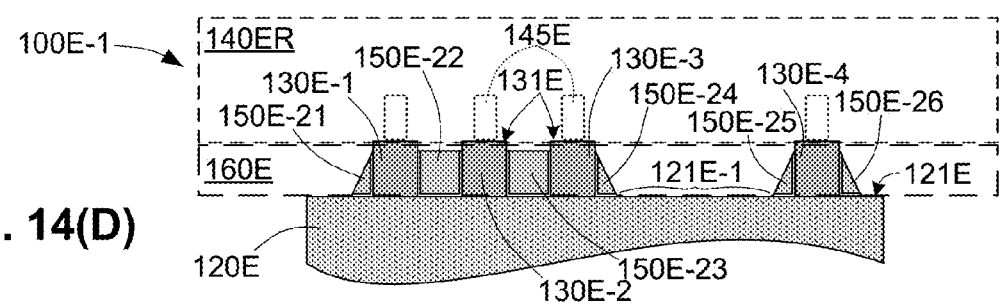
Figure 14E:
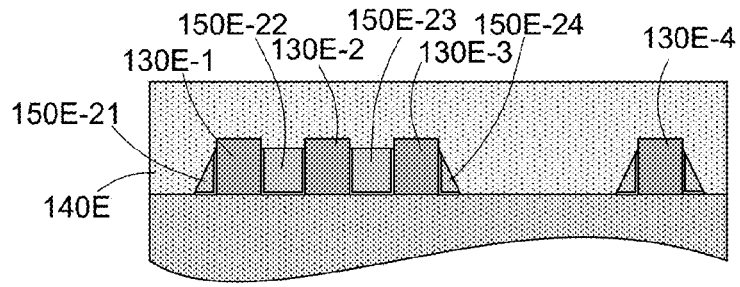
Figure 14F:
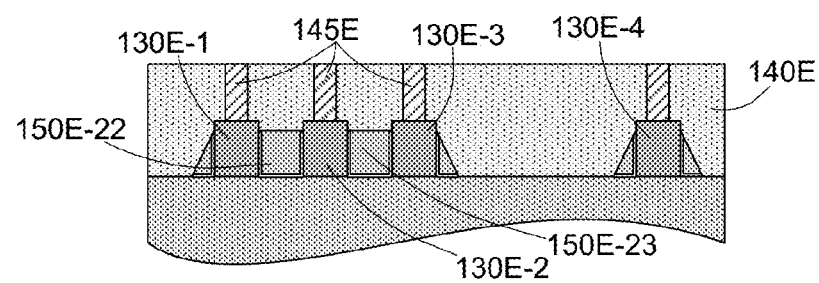
Figure 15A:
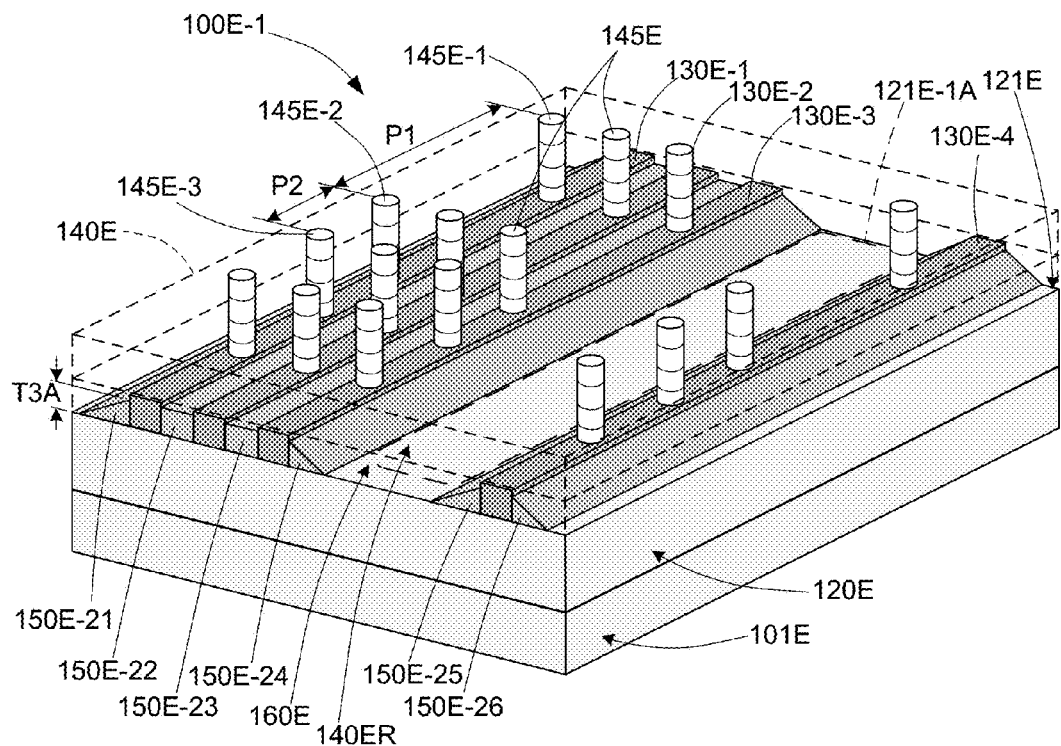
FIGS. 15(A) and 15(B) are perspective views showing RF SOI switches including self-aligned polymer-structure-type low-k features according to alternative exemplary specific embodiments.

FIG. 13 is a flow diagram indicating a generalized method for generating low-k features according to the self-aligned approach, and FIGS. 14(A) to 14(F) are simplified cross-sectional side views illustrating the associated processes. Referring to the top of FIG. 13 and to FIG. 14(A), similar to the patterned approach, the self-aligned approach is performed after previous switch structures and/or any preceding dielectric layers are formed on an SOI substrate. In addition, for reasons that will become clear below, as indicated by block 207E, the self-aligned approach is only performed after the PMD layer 120E (or any other inter-metal dielectric layer) has been completed, and (block 209E) Metal-1 line structures 130E-1 to 130E-4 (or metal line structures for the current metallization layer) have been patterned on upper surface 121E of PMD layer 120E. The specific processes corresponding to the formation of self-aligned (self-adjusting) low-k features are then performed, including forming an optional passivation layer (block 212E), depositing polymer material to form a polymer layer (block 215E), and then etching the polymer layer to expose upper portions of the metal lines (block 218E). As indicated by reference number 210E in FIG. 13, these three processes collectively provide a second specific embodiment of the generalized low-k feature formation process (block 210) of the generalized methodology shown in FIG. 2. Referring to block 212E (FIG. 13) and to FIG. 14(A), a thin dielectric layer 353E (e.g., 50A to 200A) is formed over metal line structures 130E-1 to 130E-4 and the remaining exposed portions of upper dielectric surface 131E. Dielectric layer 353E serves to prevent polymer material from sticking to metal line structures 130E-1 to 130E-4. In some embodiments, it may be possible to omit dielectric layer 353E. Referring to block 215E (FIG. 13) and to FIG. 14(B), a polymer layer 355E is then formed on dielectric layer 353E over first metal line structures 130E-1 to 130E-4. In a presently preferred embodiment, polymer layer 355E is formed by spin coating a low-k polymer material selected from the group including polyimide, polynorbornene, benzocyclobutene, polytetrafluoroethylene (PTFE), crosslinked polyphenylene and polyamide over dielectric layer 353E. As depicted in FIG. 14(B), this approach generates polymer layer 355E having a thickness that is proportional to gap distance between adjacent metal lines. That is, over relatively wide spaces (e.g., between metal line structures 130E-3 and 130E-4) the spin-coated polymer material forms thinner layer sections 355E-1 having a relatively small thickness T1. In contrast, the spin coating process causes polymer material to fill in gaps between closely spaced metal line structures (e.g., between 130E-1 to 130E-3), thereby generating thicker low-k material layer sections 355E-2 having a thickness T2 that is substantially greater than thickness T1. Referring to block 218E (FIG. 13) and to FIG. 14(C), polymer layer 355E is then etched until upper surfaces 131E of metal line structures 130E-1 to 130E-4 are exposed. In a preferred embodiment, an isotropic etch 360 is performed such that polymer material disposed in both thinner sections 355E-1 and thicker sections 355E-2 is removed substantially uniformly in the −Z-axis direction. Accordingly, after sufficient isotropic etching is performed to remove all polymer material from thinner sections 355E-1, portions of the polymer material remain in thicker sections 355-2 due to the larger amount of polymer material disposed in the Z-axis direction. As indicated in FIG. 14(D), the etch process proceeds until upper surfaces 131E of all metal line structures 130E-1 to 130E-4 are respectively exposed (i.e., such that the uppermost surfaces of all remaining polymer material is located below upper surfaces 131E). In alternative specific embodiments, control over the amount of etched polymer is achieved using either a time-based isotropic etching technique or a stop-on-metal isotropic etching technique, both being known in the art. Note also that the isotropic etching process need not remove all polymer material from between widely spaced metal lines, as indicated by exposed surface region 121E-1 of PMD layer 120E, provided upper surfaces 131E are exposed. FIG. 14(D) and FIG. 15(A) show partially formed RF SOI switch 100E-1 after the etching process is completed, whereby the formation of polymer-structure-type low-k features 150E-21 to 150E-26 is completed. The self-aligned approach relates to the generalized approach described above in that all subsequently formed first-metal via structures 145E (depicted in dashed-line form in FIG. 14(D) for reference) are located above upper surfaces 131E of Metal-1 structures 130E-1 to 130E-4 (i.e., none of the first-metal via structures disposed in the first-metal dielectric layer bypass metal structures 130E-1 to 130E-4 to contact other structures disposed below upper surface 121E of PMD layer 120E). Accordingly, the region above a plane defined by upper surfaces 131E (i.e., in the Y-axis direction) can be designated as a reserved region 140ER, so the requirement that all low-k features be disposed outside of reserved region 140ER is satisfied by way of the above-described etching process, whereby all low-k features 150E-21 to 150E-26 are located in a designated interstitial region 160E defined between upper surfaces 131E and above upper surface 121E.

According to a first aspect of the self-aligned approach, low-k features 150E-21 to 150E-26 are "self-aligned" in that the deposition and etch process reliably forms low-k features 150E-21 to 150E-26 in interstitial region 160E without the use of a mask. That is, because the polymer layer is deposited and etched without using a mask, because the isotropic etch reliably forms all low-k features below upper surfaces 131E without using a mask, and because all resulting low-k features are disposed between metal line structures 130E-1 to 130E-4 without a mask, low-k features 150E-21 and 150E-26 are self-aligned.

Figure 15B:
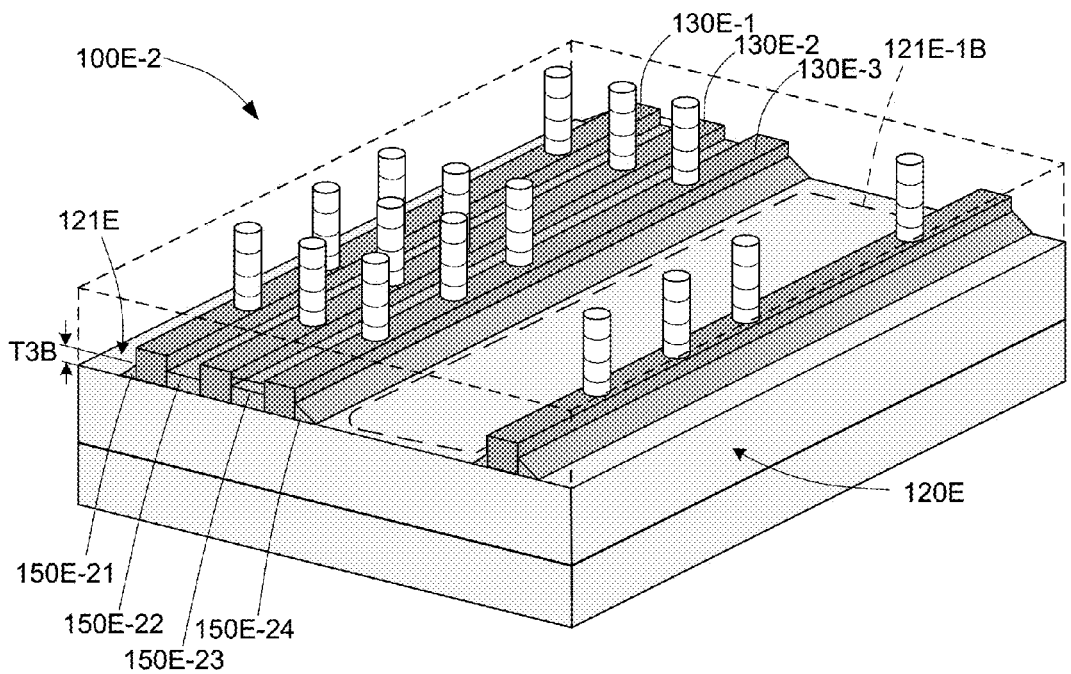

According to another aspect, the self-aligned approach is effectively "self-adjusting" because relatively thick low-k polymer structures 150E-22 and 150E-23 are formed between closely spaced (dense) metal lines (where low-k features are needed most to minimize capacitive coupling between the adjacent metal lines), and thin polymer structures (or no polymer structures) are formed between widely spaced metal lines, where low-k features are arguably not needed. That is, because the deposited polymer material forms thicker layer sections over densely pitched metal line structures (e.g., sections 355E-2 between metal line structures 130E-1 to 130E-3, shown in FIG. 14(B)) and thinner sections 355E-1 between widely spaced metal line structures, the isotropic etch produces polymer-structure-type low-k features 150E-22 and 150E-23 that substantially entirely fills the gap between closely spaced metal line structures 130E-1 and 130E-2, and the gap between closely spaced metal line structures 130E-2 and 130E-3. In contrast, in regions between widely spaced metal line structures (e.g., between structures 130E-3 and 130E-4), the isotropic etch produces smaller polymer-structure-type low-k features 150E-21, 150E-22, 150E-23 and 150E-24, and in some cases all polymer material is entirely removed (as indicated by exposed upper dielectric surface region 121E-1). Because capacitive coupling is higher between closely spaced metal lines than between widely spaced metal lines, and because the self-aligned approach produces thicker/larger low-k features 150E-22 and 150E-23 between closely spaced metal lines 130E-1 to 130E-3 than between widely spaced metal lines 130E-3 and 130E-4, the self-aligned approach can be described as self-adjusting. FIGS. 15(A) and 15(B) show partially formed RF SOI switches 100E-1 and 100E-2, and illustrate alternative embodiments in which etching time may be adjusted to balance the thickness of low-k features with the amount of surface area covered by polymer material. As explained above, the size (thickness) of low-k features 150E-21 to 150E-26 is adjustable by way of adjusting the time or other parameters associated with the etching process, but maximizing the thickness causes more of the surrounding surface area to be covered by polymer material. FIG. 15(A) shows switch 100E-1 low-k features 150E-21 to 150E-26 with features having thicknesses T3A above upper surface 121E of dielectric layer 120E, corresponding to an etching process designed to produce relatively thick features. Note that area 120E-1A between metal lines 130E-3 and 130E-4 is made smaller due to the larger size of features 150E-24 and 150E-25. In contrast, switch 100E-2 (FIG. 15(B)) includes low-k features 150E-21 to 150E-26 with features having smaller thicknesses T3B above upper surface 121E of dielectric layer 120E, corresponding to an etching process designed to produce relatively thin features, whereby area 120E-1B between metal lines 130E-3 and 130E-4 is made larger due to the smaller size of features 150E-24 and 150E-25 (i.e., less of surface 121E is covered by polymer material). By adjusting the etching time, an optimal balance between surface area covered by polymer and low-k feature sizes may be achieved. Referring again to FIG. 15(A), another benefit of the self-aligned approach is that there is no restriction on the spacing between contact/via structures. That is, as described above with reference to FIGS. 7(A) and 11(A), some versions of the patterned approach require relatively large pitch distances between contact/via structures. In contrast, as indicated in FIG. 15(A), via structures 145E can be spaced at any desired pitch distance (e.g., a relatively large pitch distance P1 indicated between via structures 145E-1 and 145E-2, or a relatively small pitch distance P2 indicated between via structures 145E-2 and 145E-3).

Although the present invention has been described with respect to certain specific embodiments, it will be clear to those skilled in the art that the inventive features of the present invention are applicable to other embodiments as well, all of which are intended to fall within the scope of the present invention. For example, although the various approaches are described with reference to certain specific embodiments that only depict the currently-described approach, the various approaches may be combined in a single RF SOI switch. In addition, as suggested by feature 150-3 in FIG. 1, the various approaches described herein may also be utilized to produce low-k features in any of the dielectric layers located above the first-metal dielectric layer.

The invention claimed is:

1. A method for fabricating a radio frequency (RF) silicon-on-insulator (SOI) switch on an SOI substrate such that said RF SOI switch includes first and second elongated spaced-apart source/drain regions separated by an elongated channel region, an elongated polycrystalline silicon (polysilicon) gate structure disposed over the channel region, at least two dielectric layers comprising one or more dielectric materials having a first dielectric constant disposed on an upper surface of the substrate, and a plurality of metal contact/via structures disposed in said at least two dielectric layers, the method comprising:
    forming a low dielectric constant (low-k) feature over said substrate in an associated interstitial region;
    forming a dielectric layer of said two or more dielectric layers including depositing one or more dielectric materials having a first dielectric constant into first and second reserved regions disposed on opposite sides of said interstitial region; and
    forming a plurality of periodically spaced metal structures that extend through said dielectric layer only in said first and second reserved regions such that each of said plurality of periodically spaced metal structures is entirely surrounded by said one or more dielectric materials forming said dielectric layer.

2. The method of claim 1, further comprising forming a first dielectric layer and forming a plurality of first metal line structures on said first dielectric layer,
    wherein forming the low-k feature comprises:
    forming a polymer layer over said first metal line structures, and
    etching said polymer layer until upper surfaces of said metal line structures are exposed.

3. The method of claim 2, forming the low-k features further comprises forming a thin dielectric layer over said plurality of first metal line structures prior to forming said polymer layer.

4. The method of claim 3, wherein forming said polymer layer comprises spin coating one of polyimide, polynorbornene, benzocyclobutene, polytetrafluoroethylene, crosslinked polyphenylene and polyamide over said thin dielectric layer.

5. The method of claim 4, wherein etching said polymer material comprises performing one of a time-based isotropic etch and a stop-on-metal isotropic etch.

6. The method of claim 1, wherein forming the low-k features comprises utilizing one or more masks to form one or more patterned polymer structures.

7. The method of claim 6, wherein forming said patterned polymer structures comprises forming at least one said patterned polymer structure in at least one of a pre-metal dielectric layer, a first inter-metal dielectric layer, and a dielectric layer formed above said first inter-metal dielectric layer of said RF SOI switch.

8. The method of claim 6, wherein forming said patterned polymer structures comprises patterning one of polyimide, polynorbornene, benzocyclobutene and polytetrafluoroethylene, crosslinked polyphenylene and polyamide.

9. The method of claim 6, wherein utilizing said one or more masks comprises forming a plurality of parallel elongated polymer structures extending perpendicular to said polysilicon gate structure.

10. The method of claim 6, wherein utilizing said one or more masks comprises forming one or more polymer structures disposed in mesh-type pattern over said polysilicon gate structure.

11. The method of claim 6, wherein utilizing said one or more masks comprises forming a plurality of parallel elongated polymer structures extending parallel to said polysilicon gate structure.

12. The method of claim 6,
    wherein forming the low-k features further comprises:
    forming a first passivation layer;
    forming said one or more patterned polymer structure on said first passivation layer; and
    forming a second passivation layer over said patterned polymer structures, and
    wherein forming said dielectric layer comprises depositing said one or more dielectric materials on said second passivation layer.

13. The method of claim 12, further comprising, before forming said dielectric layer:
    etching a plurality of openings through said second passivation layer, and
    removing said polymer from between said first and second passivation layers such that a void region is defined between said first and second passivation layers,
    wherein depositing said one or more dielectric materials comprises causing a portion of said deposited dielectric material to plug said plurality of openings.

* * * * *